(12) United States Patent
Kish, Jr. et al.

(10) Patent No.: US 6,891,202 B2
(45) Date of Patent: May 10, 2005

(54) OXYGEN-DOPED AL-CONTAINING CURRENT BLOCKING LAYERS IN ACTIVE SEMICONDUCTOR DEVICES

(75) Inventors: Fred A. Kish, Jr., Palo Alto, CA (US); Sheila K. Mathis, Sunnyvale, CA (US); Charles H. Joyner, Sunnyvale, CA (US); Richard P. Schneider, Mt. View, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 10/319,962

(22) Filed: Dec. 16, 2002

(65) Prior Publication Data

US 2003/0173571 A1 Sep. 18, 2003

Related U.S. Application Data

(60) Provisional application No. 60/340,319, filed on Dec. 14, 2001.

(51) Int. Cl.[7] .............................................. H01L 33/00
(52) U.S. Cl. ........................... 257/96; 257/97; 257/102; 257/101; 257/103; 257/94; 372/46; 372/45; 372/50
(58) Field of Search ........................... 257/96, 97, 102, 257/101, 103, 94; 372/46, 45, 50

(56) References Cited

U.S. PATENT DOCUMENTS

| | | | |
|---|---|---|---|
| 4,231,050 A | 10/1980 | Casey, Jr. et al. | ............. 357/16 |
| 4,309,670 A | * 1/1982 | Burnham et al. | ............. 372/46 |
| 4,317,085 A | 2/1982 | Burnham et al. | ............. 372/50 |
| 4,378,255 A | 3/1983 | Holonyak, Jr. et al. | ....... 148/1.5 |
| 4,470,143 A | 9/1984 | Kitamura et al. | ............. 372/50 |
| 4,511,408 A | 4/1985 | Holonyak, Jr. | ................ 148/1.5 |
| 4,594,603 A | 6/1986 | Holonyak, Jr. | ................ 357/16 |
| 4,639,275 A | 1/1987 | Holonyak, Jr. | ................ 148/1.5 |

(Continued)

FOREIGN PATENT DOCUMENTS

| | | | |
|---|---|---|---|
| EP | 208209 B1 | 1/1987 | ............. H01S/3/19 |
| EP | 314372 A2 | 5/1989 | ............. H01S/3/19 |
| GB | 2301934 A | 12/1996 | ........... H01L/33/00 |
| JP | 61290790 | 12/1986 | ............. H01S/3/18 |
| JP | 7-30185 | * 1/1995 | |

OTHER PUBLICATIONS

J. S. McCalmont et al., "The Effect of Oxygen Incorporation in Semi–Insulating $(Al_xGa_{1-x})_yIn_{1-y}P$", *Journal of Applied Physics*, vol. 71(2), pp. 1046–1048, Jan. 15, 1992.

(Continued)

*Primary Examiner*—Jerome Jackson
*Assistant Examiner*—Joseph Nguyen
(74) *Attorney, Agent, or Firm*—W. Douglas Carothers, Jr.

(57) ABSTRACT

An active semiconductor device, such as, buried heterostructure semiconductor lasers, LEDs, modulators, photodiodes, heterojunction bipolar transistors, field effect transistors or other active devices, comprise a plurality of semiconductor layers formed on a substrate with one of the layers being an active region. A current channel is formed through this active region defined by current blocking layers formed on adjacent sides of a designated active region channel where the blocking layers substantially confine the current through the channel. The blocking layers are characterized by being an aluminum-containing Group III-V compound, i.e., an Al-III-V layer, intentionally doped with oxygen from an oxide source. Also, wet oxide process or a deposited oxide source may be used to laterally form a native oxide of the Al-III-V layer. An example of a material system for this invention useful at optical telecommunication wavelengths is InGaAsP/InP where the Al-III-V layer comprises InAlAs:O or InAlAs:O:Fe. Other materials for the blocking layers may be InAlGaAs or alternating layers or alternating monolayers of AlAs/InAs. Thus, the O-doped blocking layers may be undoped, impurity doped or co-doped with Fe.

81 Claims, 16 Drawing Sheets

U.S. PATENT DOCUMENTS

| | | | |
|---|---|---|---|
| 4,660,208 A | 4/1987 | Johnston, Jr. et al. | 372/46 |
| 4,716,130 A | 12/1987 | Johnston, Jr. et al. | 437/104 |
| 4,738,934 A | 4/1988 | Johnston, Jr. et al. | 437/22 |
| 4,817,103 A | 3/1989 | Holonyak, Jr. | 372/45 |
| 4,888,624 A | 12/1989 | Johnston, Jr. et al. | 357/16 |
| 4,999,315 A | 3/1991 | Johnston, Jr. et al. | 439/94 |
| 5,148,439 A | 9/1992 | Wiinstel et al. | 372/46 |
| 5,262,360 A | 11/1993 | Holonyak, Jr. et al. | 437/237 |
| 5,400,354 A | 3/1995 | Ludowise et al. | 372/46 |
| 5,517,039 A | 5/1996 | Holonyak, Jr. et al. | 257/94 |
| 5,550,081 A | 8/1996 | Holonyak, Jr. et al. | 437/129 |
| 5,580,382 A | 12/1996 | Jackson et al. | 117/104 |
| 5,679,603 A | 10/1997 | Kimura et al. | 437/133 |
| 5,763,291 A | 6/1998 | Motoda et al. | 438/39 |
| 5,804,840 A | 9/1998 | Ochi et al. | 257/94 |
| 5,821,155 A | 10/1998 | Izumi et al. | 438/479 |
| 5,865,888 A | 2/1999 | Min et al. | 117/85 |
| 5,888,294 A | 3/1999 | Min et al. | 117/84 |
| 5,909,051 A | 6/1999 | Stockman et al. | 257/610 |
| 5,933,442 A | 8/1999 | Sawano et al. | 372/45 |
| 6,019,840 A | 2/2000 | Hartmann et al. | 117/89 |
| 6,028,875 A | 2/2000 | Knight et al. | 372/46 |
| 6,037,003 A | 3/2000 | Gordon et al. | 427/255.34 |
| 6,201,264 B1 | 3/2001 | Khare et al. | 257/97 |
| 6,281,523 B1 | 8/2001 | Iwai et al. | 257/98 |
| 6,287,884 B1 | 9/2001 | Jie et al. | 438/39 |
| 2001/0020703 A1 | 9/2001 | Gardner et al. | 257/87 |

OTHER PUBLICATIONS

S. Bouchoule et al., "New Buried Heterostructure Using MOVPE Selective Regrowth of Semi–Insulating (SI–) InAlAs for Low Capacitance Optical Sources", Conference Paper, pp. 883–884, 2001.

J. C. Chen et al., "Effects of Trimethylindium on the Purity of In0.5Al0.5P and In0.5Al0.5As Epilayers Grown by Metalorganic Chemical Vapor Deposition", *Journal of Electronic Materials*, vol. 26(4), pp. 361–365, 1997.

Nathan F. Gardner et al., "Semi–Insulating InP Grown at low Temperature by Metalorganic Chemical Vapor Deposition", *Applied Physics Letters*, vol. 65(3), pp. 359–361, Jul. 18, 1994.

Nathan F. Gardner et al., "Effect of Growth on the Electrical Properties of $CCl_4$–Doped Semi–Insulating InP", vol. 67(20), pp. 3004–3006, Nov. 13, 1995.

J. W. Huang et al., "Controlled Oxygen Incorporation in Indium Gallium Arsenide and Indium Phosphide Grown by Metalorganic Vapor Phase Epitaxy", $7^{TH}$ *Biennial Workshop on Organometallic Vapor Phase Epitaxy*, Fort Meyers, FL, Apr. 2–6, Apr., 1995, vol. 24(11), pp. 1539–1546.

J. W. Haung et al., "Controlled Oxygen Incorporation in Indium Gallium Arsenide and Indium Phosphide Grown by Metalorganic Vapor Phase Epitaxy", *Journal of Electronic Materials*, vol. 24(11), pp. 15391546, 1995.

E. Hall et al., "Increased Lateral Oxidation Rates of AlInAs on InP Using Short–Period Superlattices", *Journal of Electronic Materials*, vol. 29(9), pp. 1100–1104 (162–166), 2000.

Ryan L. Naone et al., "AlAs Oxidation Rate dependence on Adjacent Layer Composition", *Electronic Materials Conference*, Paper No. AM BB4, Charlottesville, VA, Jun. 22–24, 1998, p. 113.

M. R. Krames et al., "Deep–Oxide Planar Buried–Heterostructure AlGaAs–GaAs Quantum Well Heterostructure Laser Diodes", *Applied Physics Letters*, vol. 65(25), pp. 3221–3223, Dec. 19, 1994.

M. R. Krames et al., "Buried–Oxide Ridge–Waveguide InAlAs–InP–InGaAsP ($\lambda \sim 1.3 \mu m$) Quantum Well Heterostructure Laser Diodes", *Applied Physics Letters*, vol. 64(21), pp. 2821–2823, May 28, 1994.

M. R. Krames et al., "Improved Thermal Stability of AlGaAs–GaAs Quantum Well Heterostructures Using a 'Blocking' Zn Diffusion to Reduce Column–III Vacancies", *Applied Physics Letters*, vol. 67(13), pp. 1859–1861, Sep., 1995.

M. R. Krames et al., "Deep–Oxide Planar Buried–Channel AlGaAs–GaAs Quantum Well Heterostructure Waveguides with Low Bend Loss" *Applied Physics Letters*, vol. 66(1.5), pp. 1912–1914, Apr. 10, 1995.

M. R. Krames et al., "Deep–Oxide Curved Resonator for Low–Threshold AlGaAs–GaAs Quantum Well Heterostructure Ring Lasers", *Applied Physics Letters*, vol. 67(1) pp. 73–75, Jul. 3, 1995.

E. Adomaitis et al., "Picosecond Photoconductivity in InP:Fe:O", *Semiconductor Science and Technology*, vol. 4(7), pp. 553–556, Jul., 1989.

O. V. Kulikova et al., "On the Possibility of Formation of Associated Impurity Centers in Semi–Insulating Indium Phosphide Doped by Oxygen", Physica Status Solidi A, vol. 107(1), pp. K57–K60, May 16, 1988.

P. N. Favennec et al., "Migration of Iron–Doped InP After Implantation of Acceptor, Donor and Neutral Impurities", Semi–Insulating III–V Materials, Kah–nee–ta, OR, USA, Apr. 24–26, 1984, pp. 26–35, Shiva Publishing, Nantwich, UK, 1984.

S. Naritsuka et al., "Electrical properties and origin of Deep levels in Undoped InAlAs Layers", *Fourth International Conference on Indium Phosphide and Related Materials*, Newport, Rhode Island, pp. 105–108, Apr. 21–24, 1992.

H. Ishikawa et al., Highly Resistive Iron–Doped AlInAs Layers Grown by Metalorganic Chemical Vapor Deposition, Japanese Journal of Applied Physics, Part 2 (Letters), vol. 31(4A), pp. L376–L378, Apr. 1, 1992.

* cited by examiner

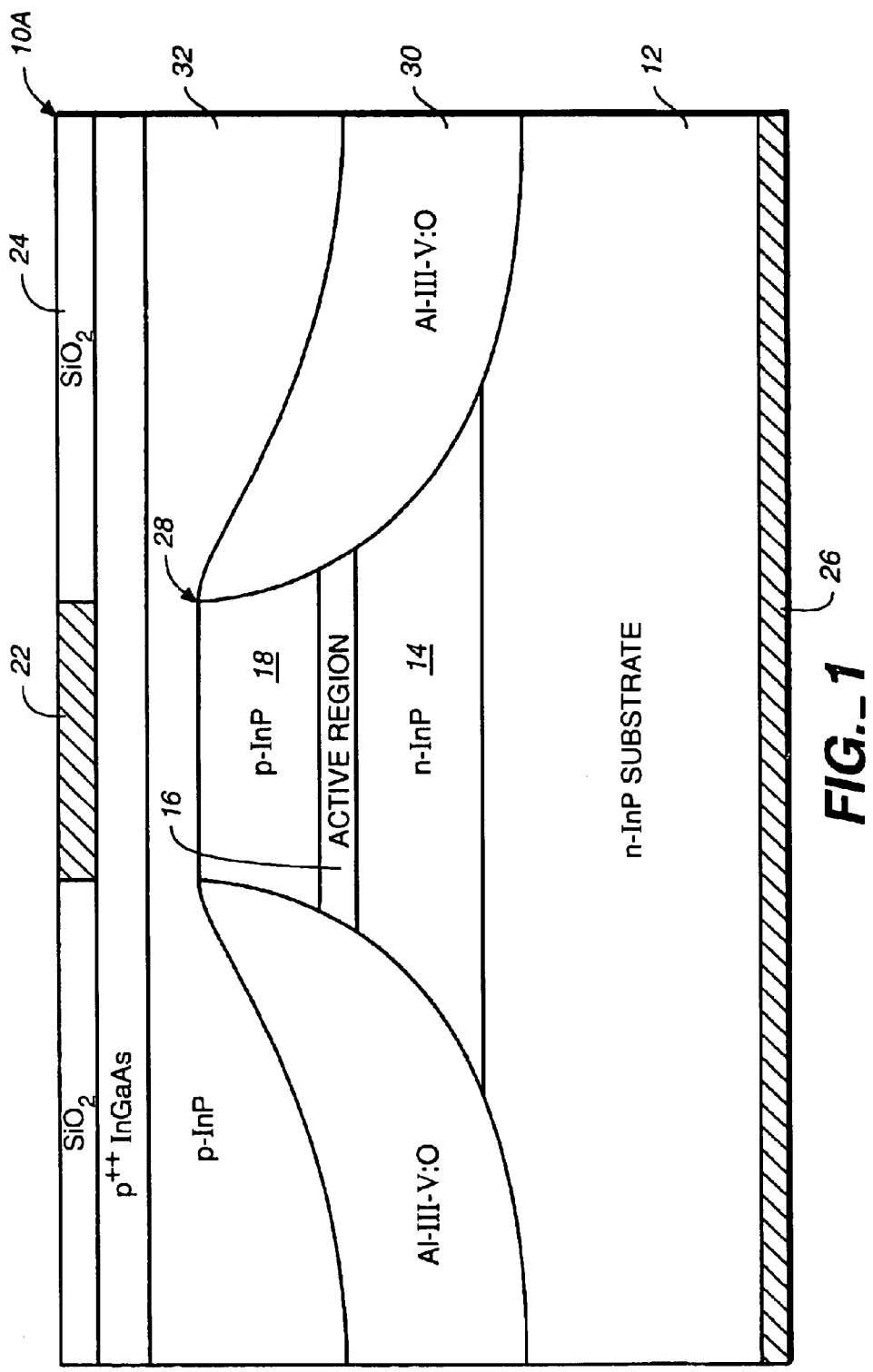
FIG._1

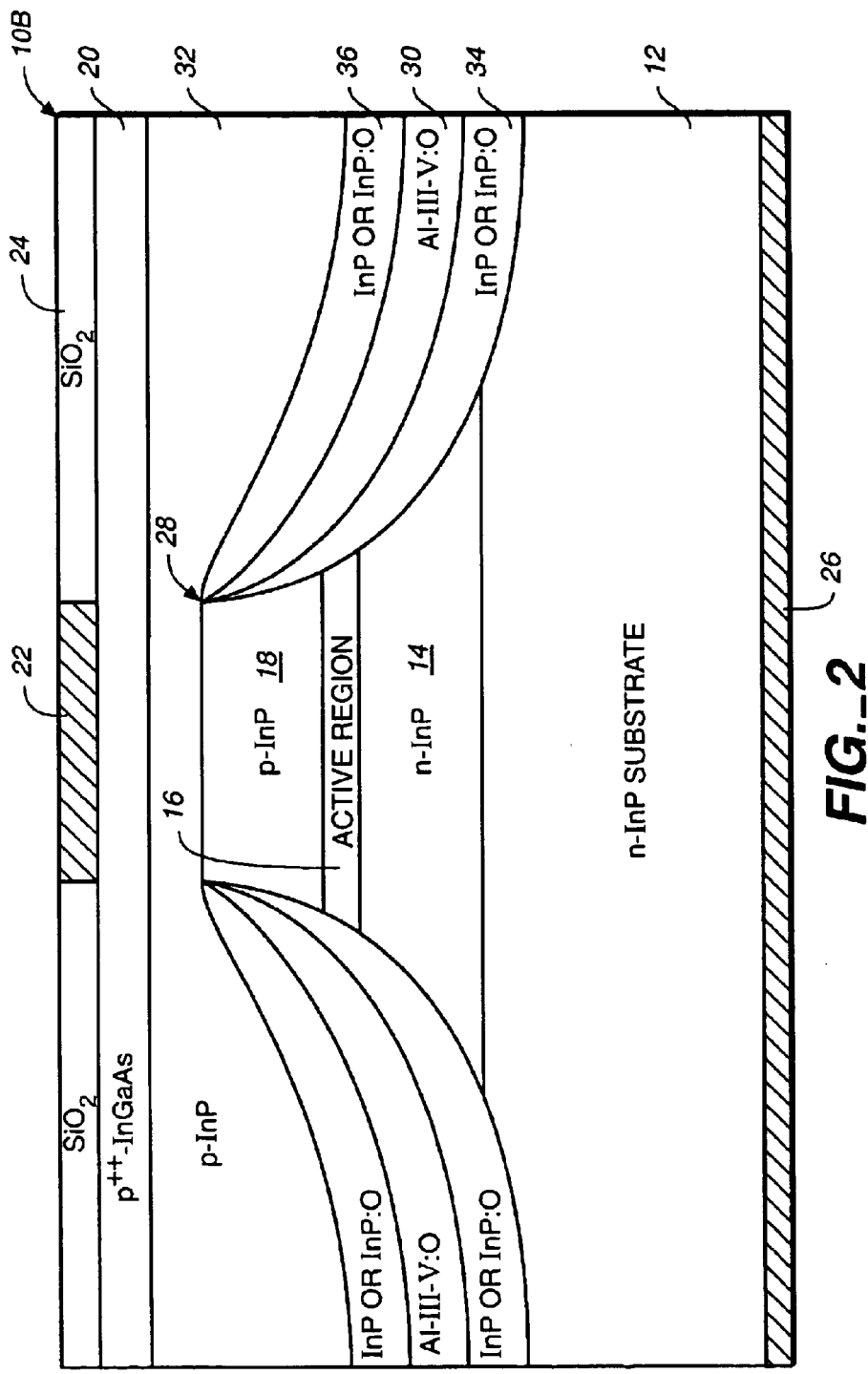
FIG._2

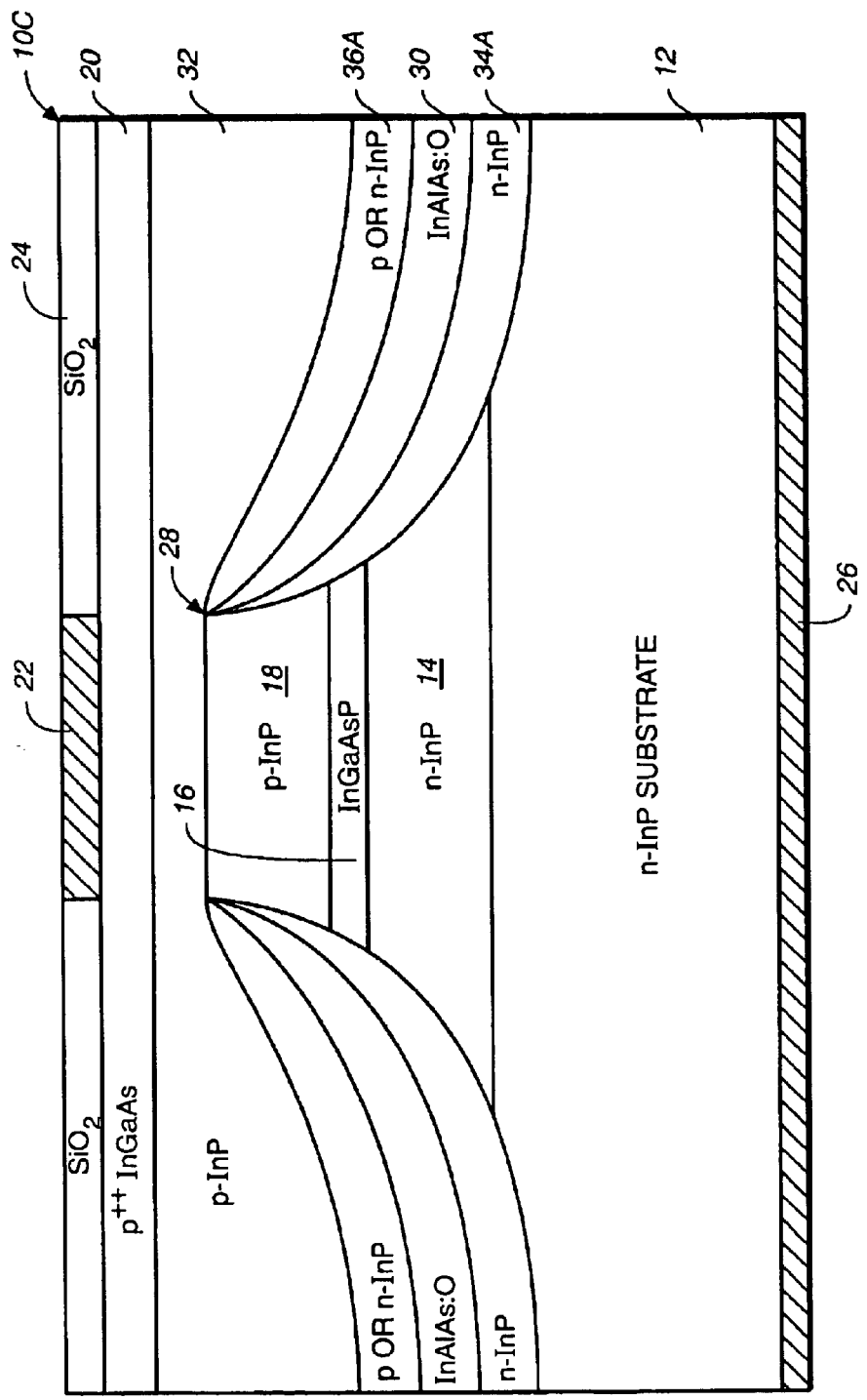
FIG._3

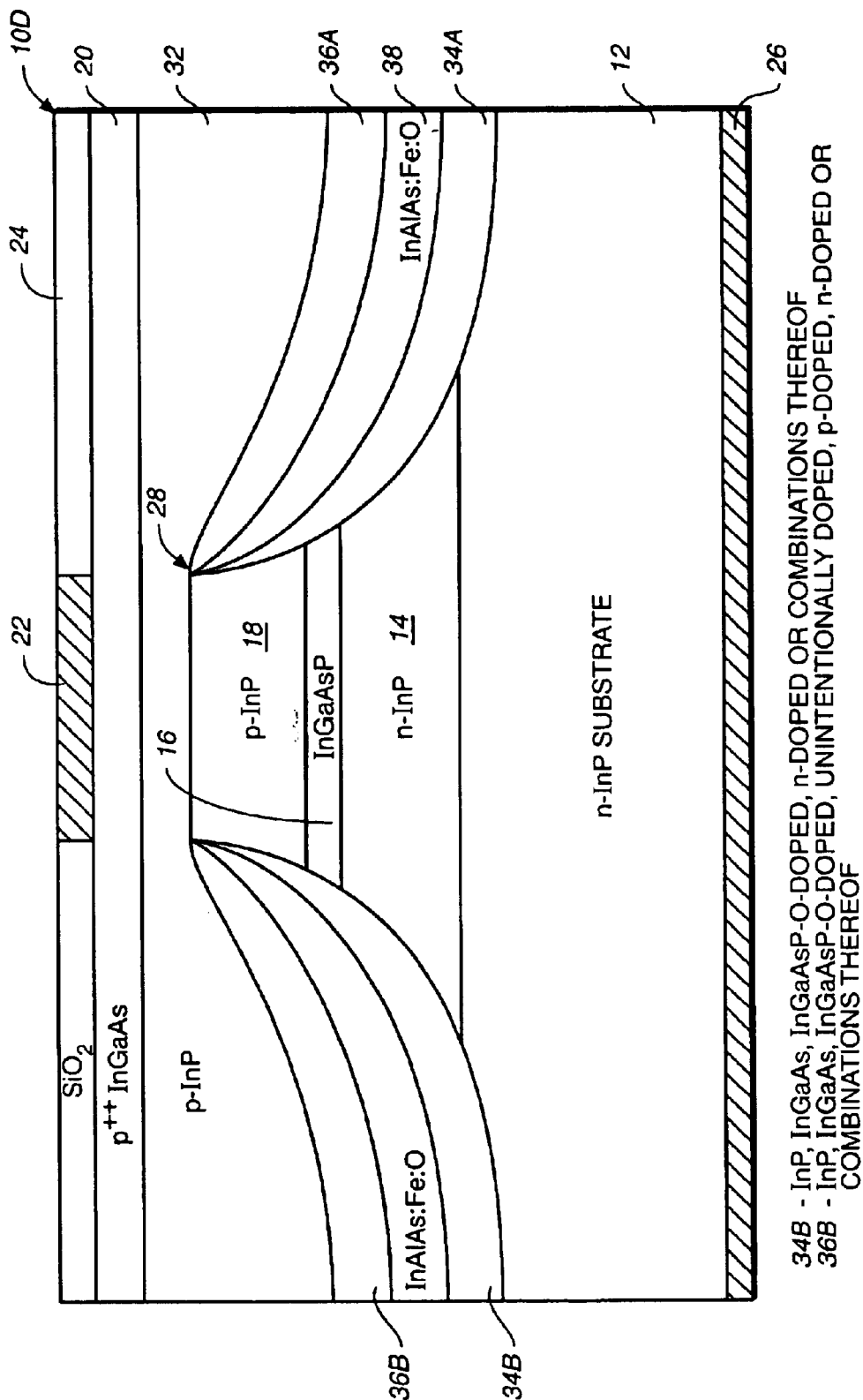
FIG._4

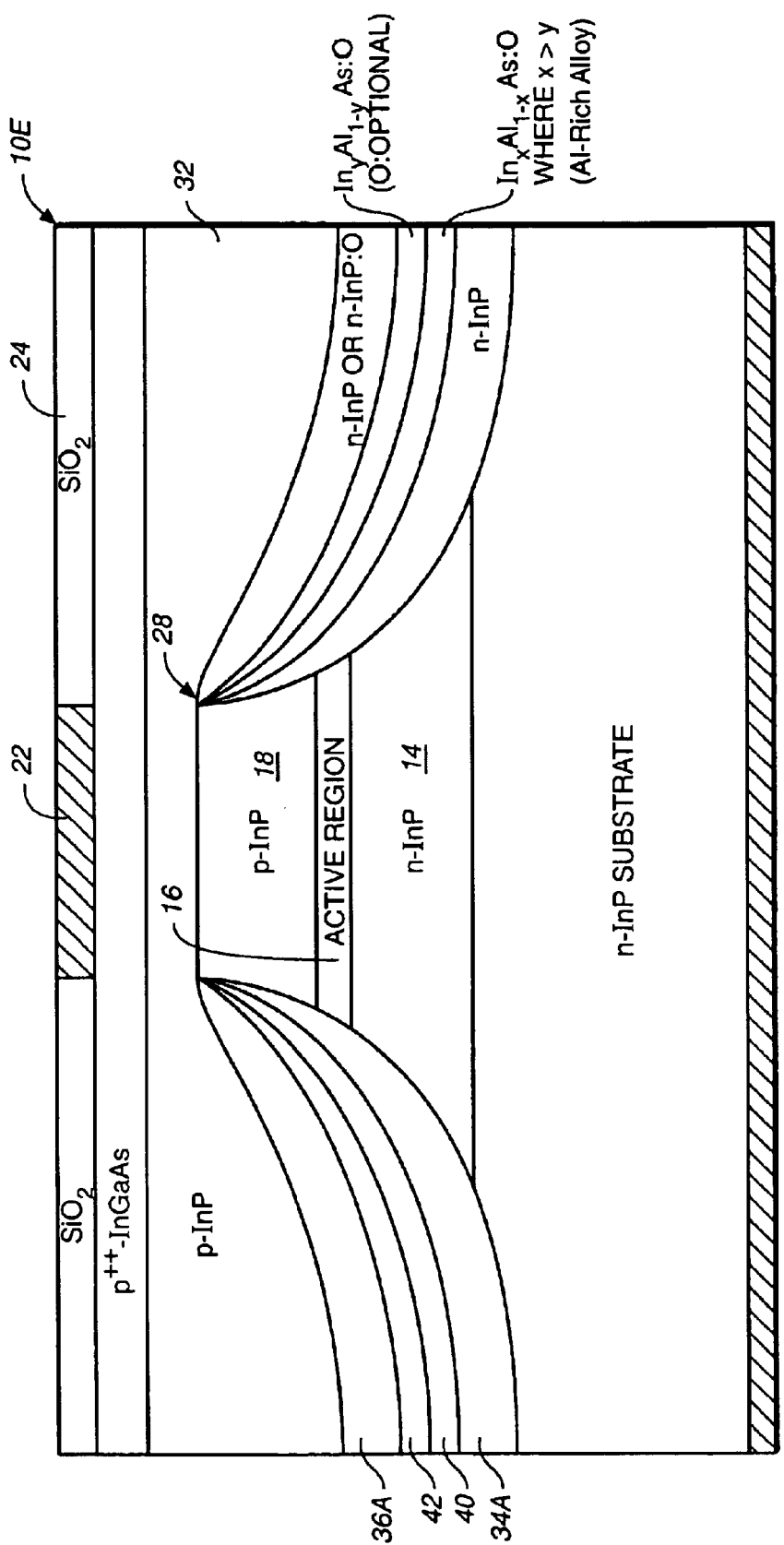
FIG._5

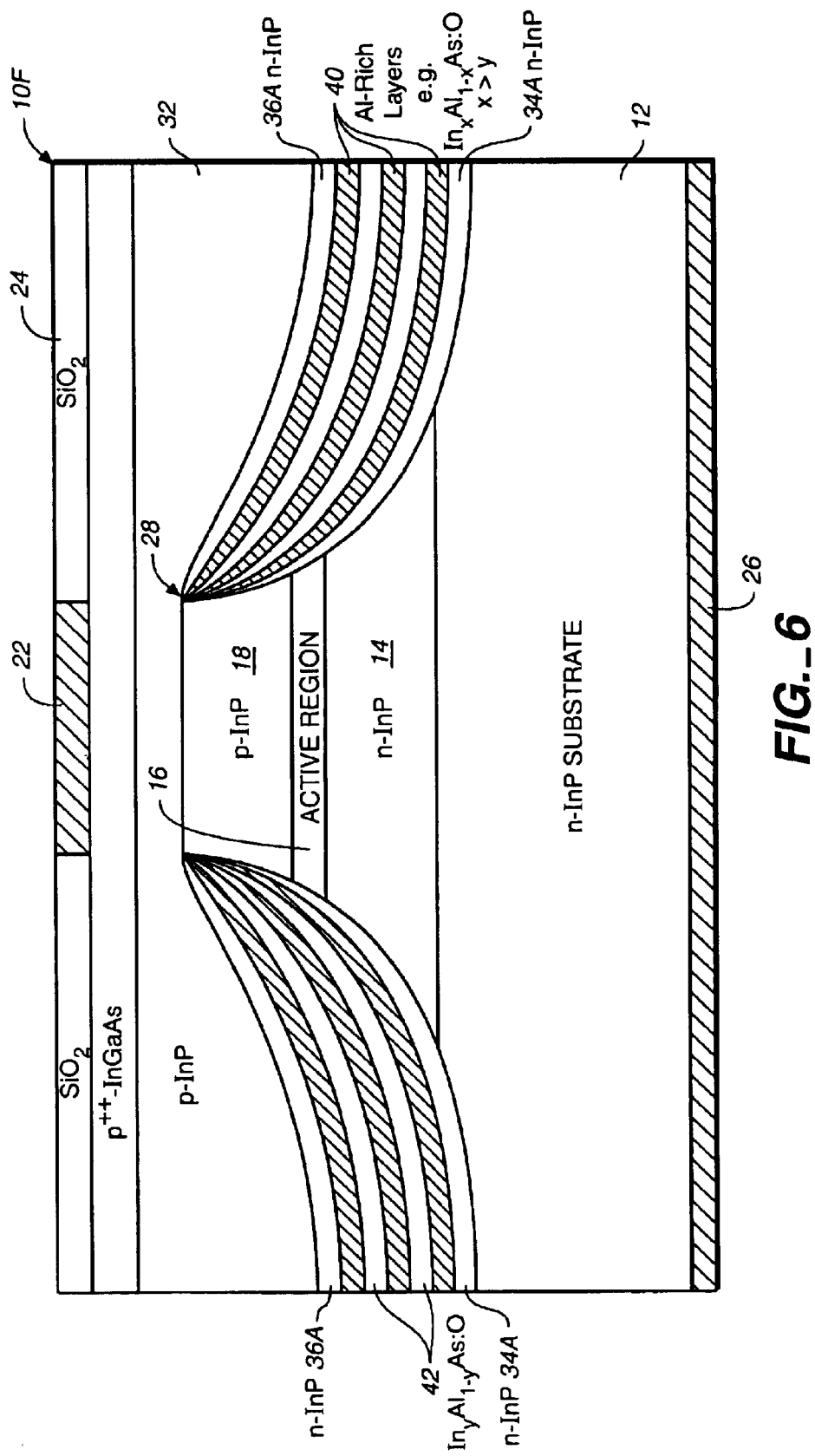
FIG._6

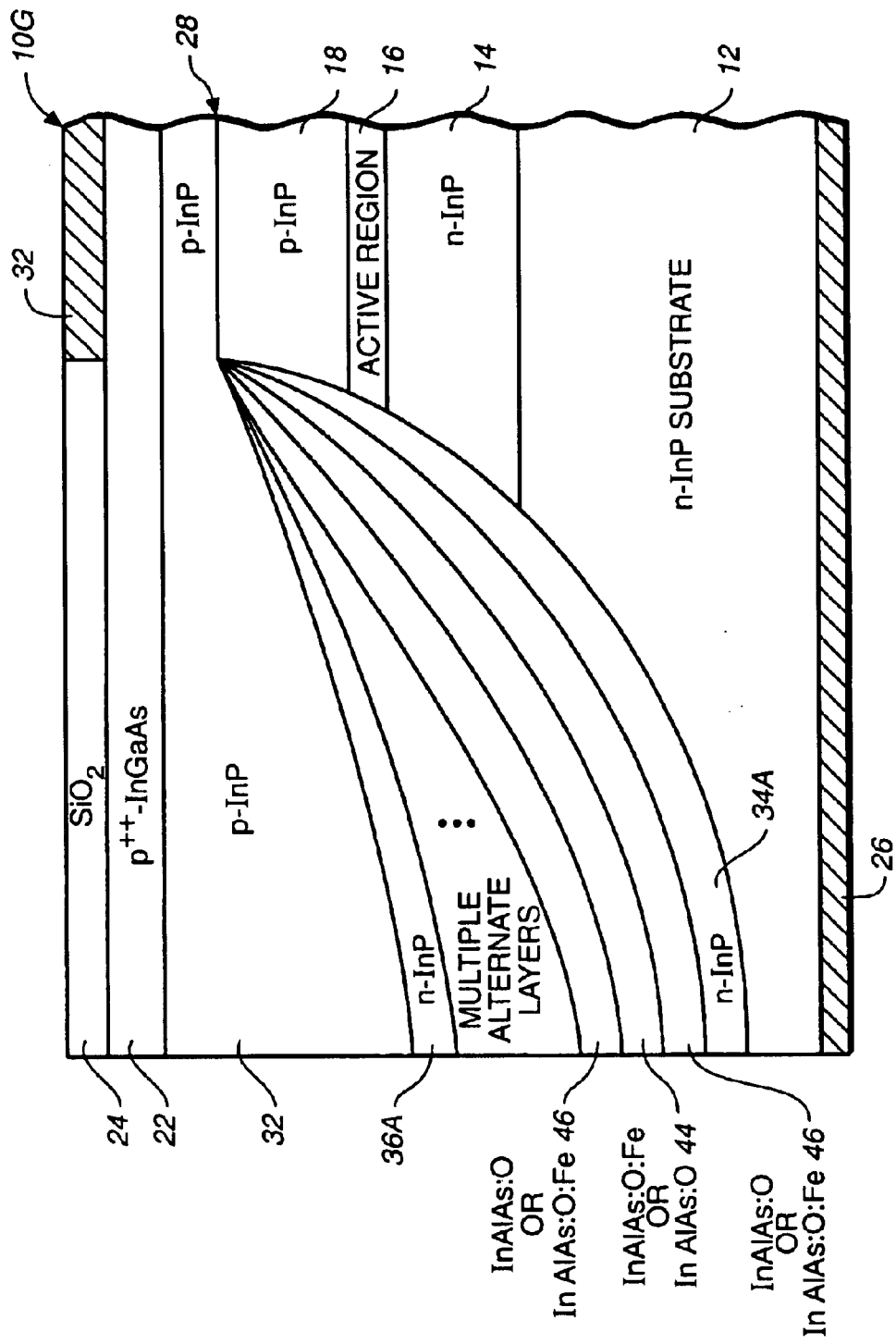
FIG._7A

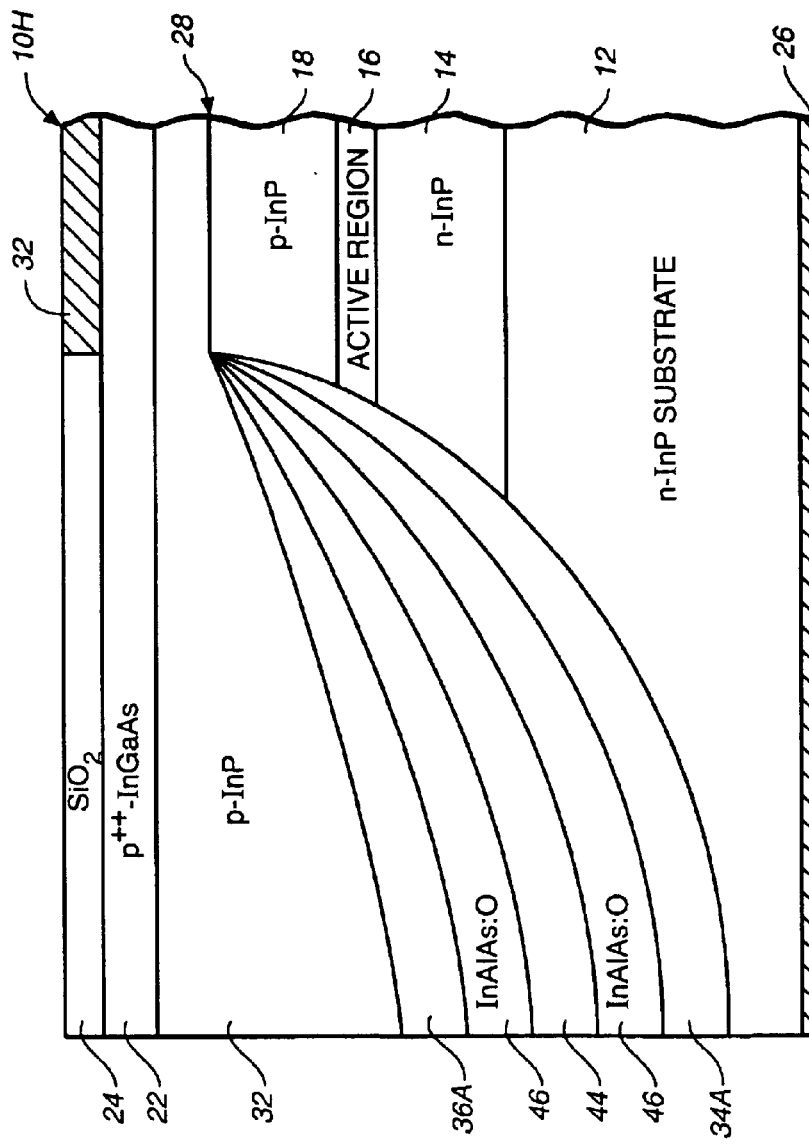
FIG._7B

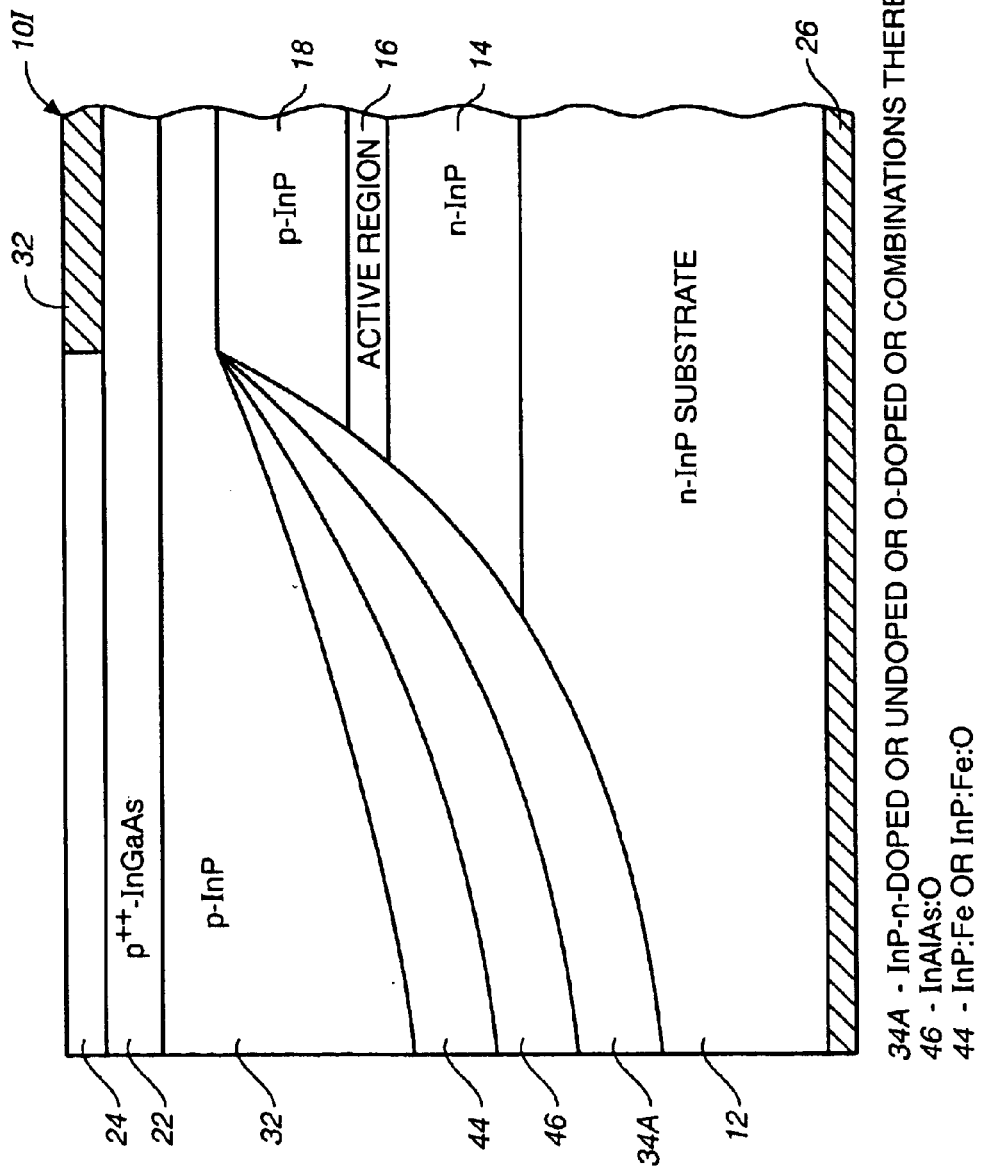
FIG._7C

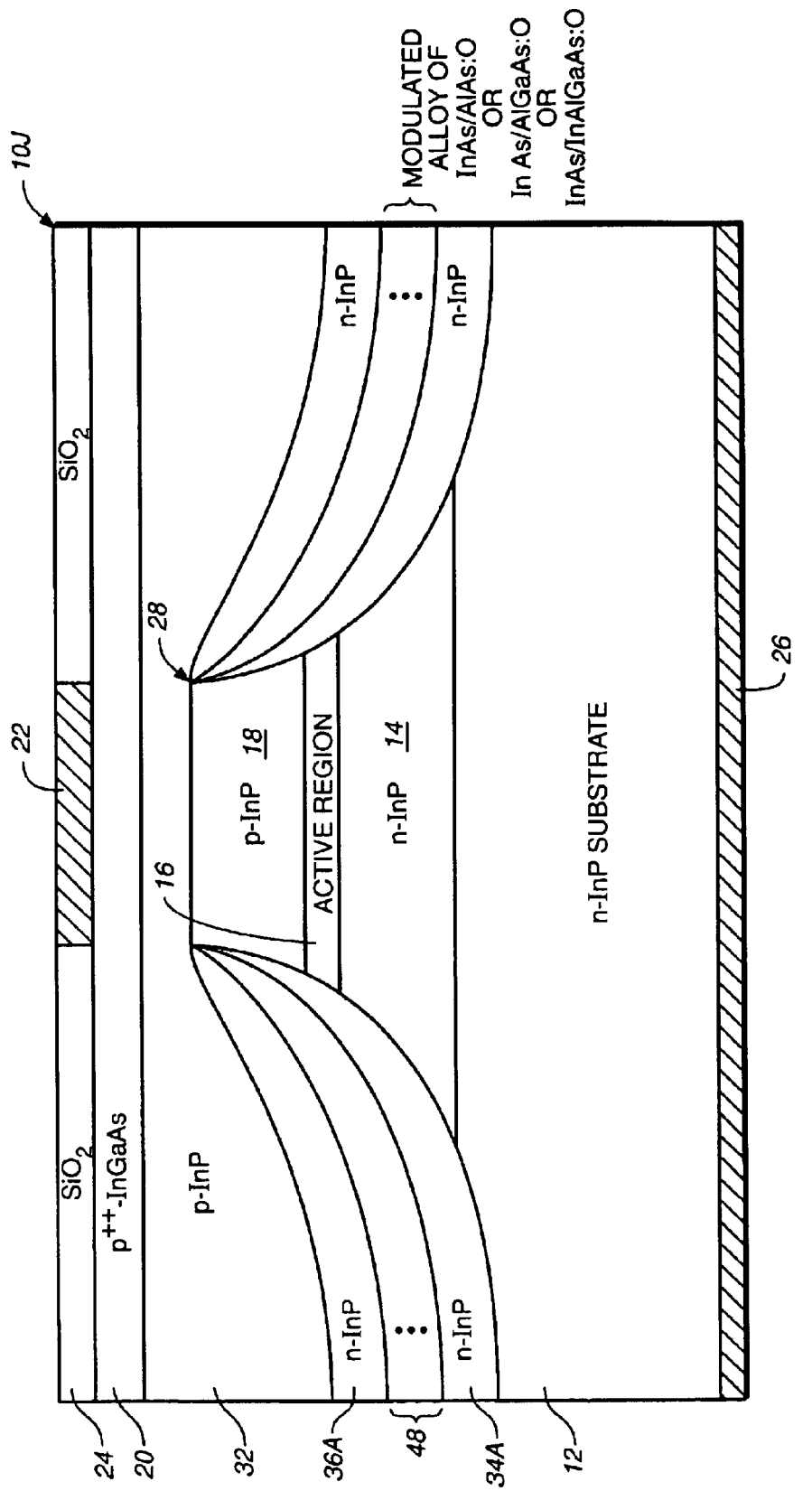
FIG._8

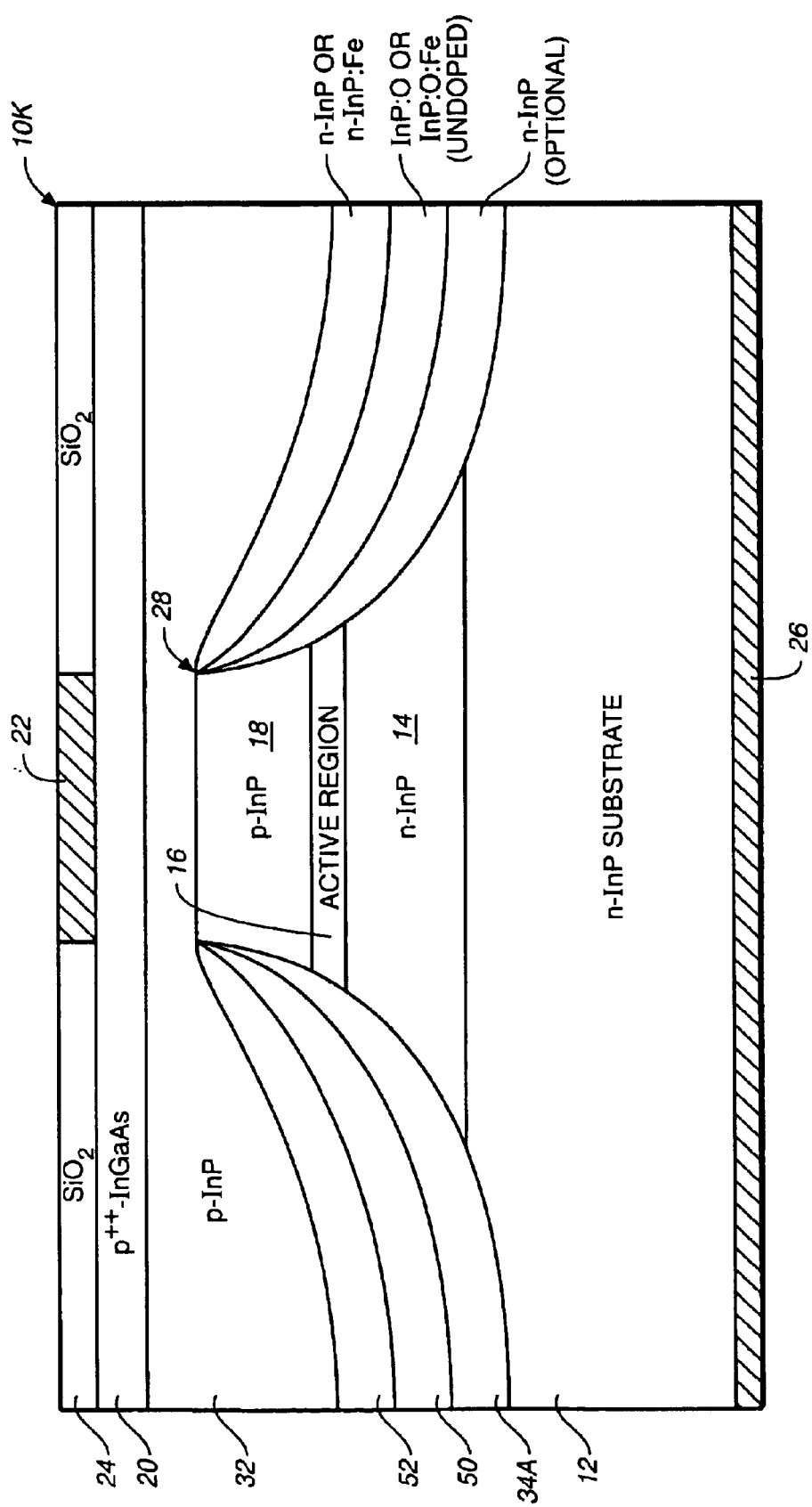
FIG._9A

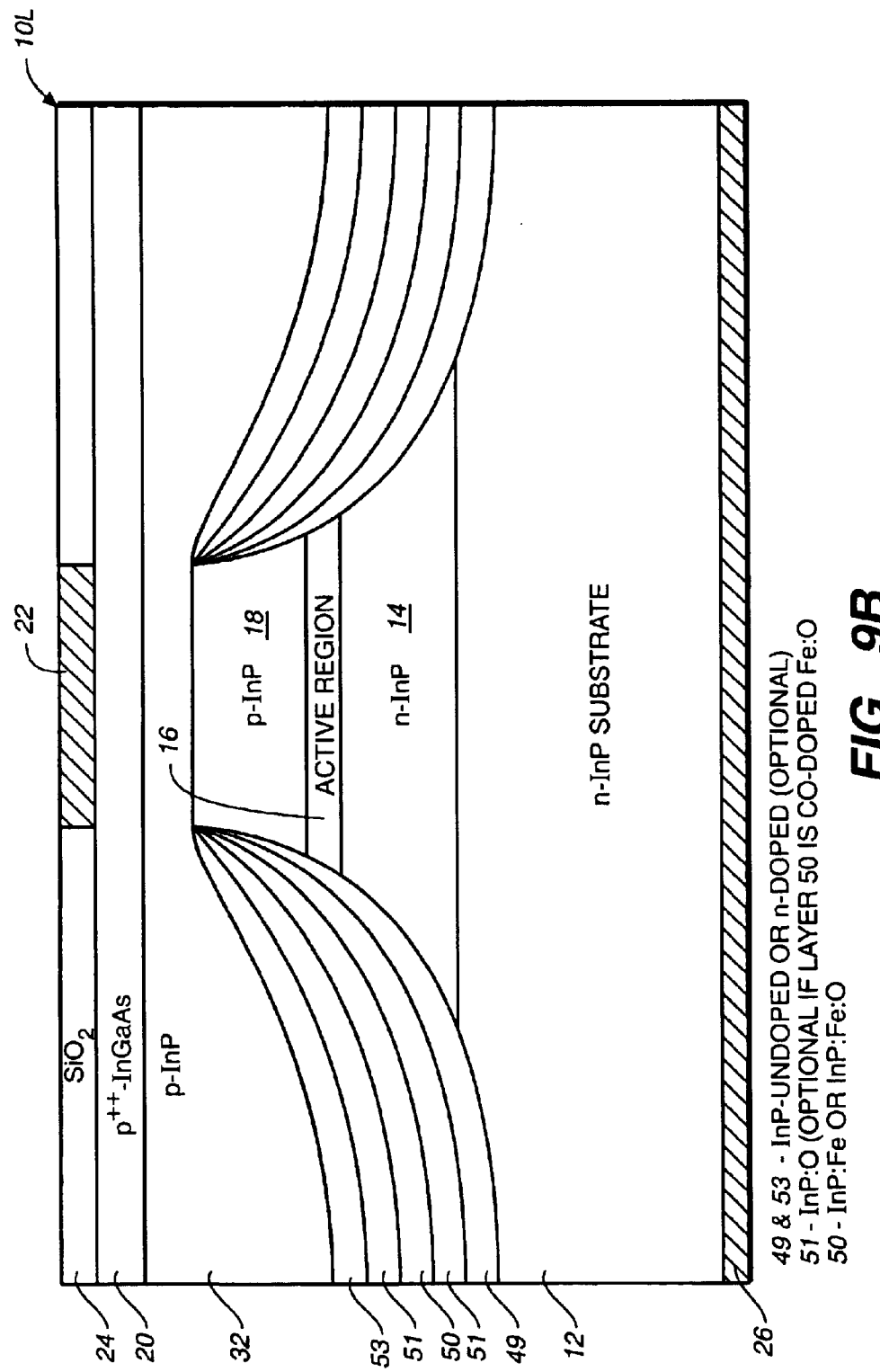

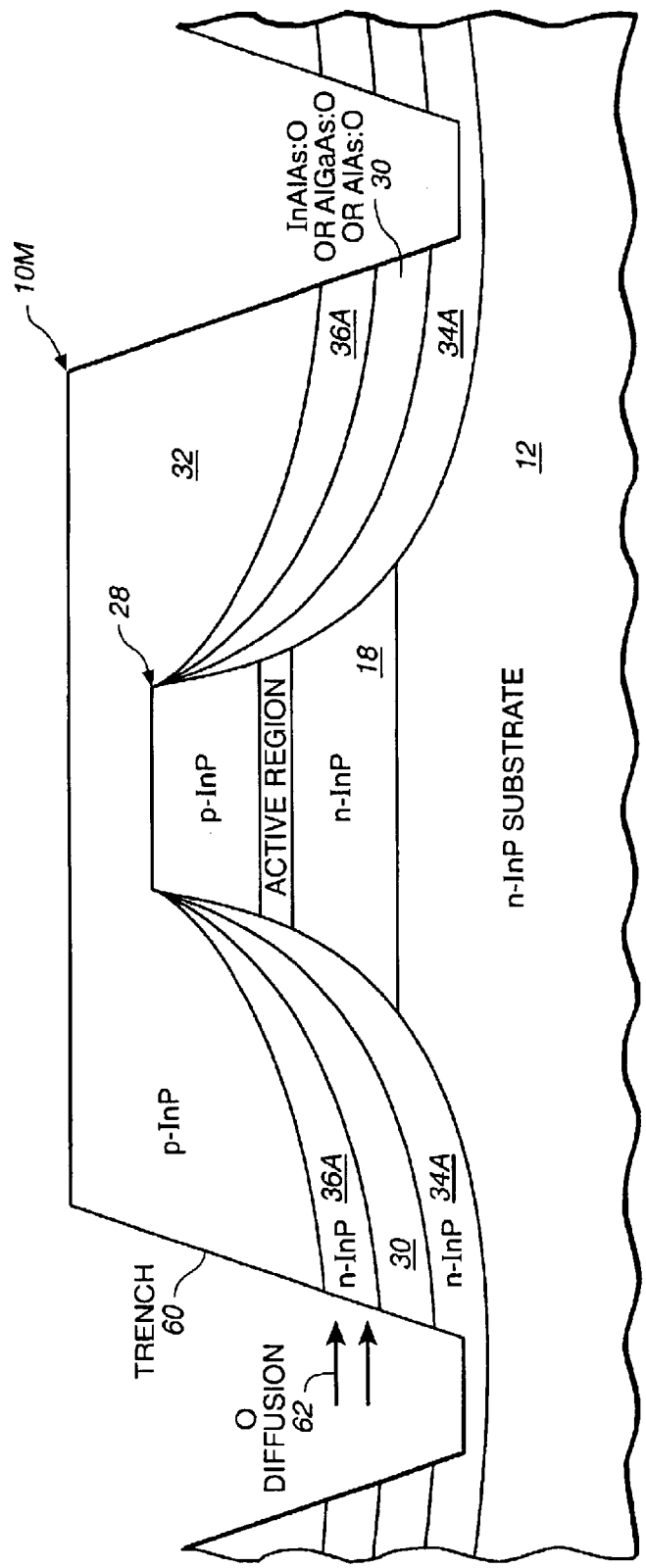
FIG._10

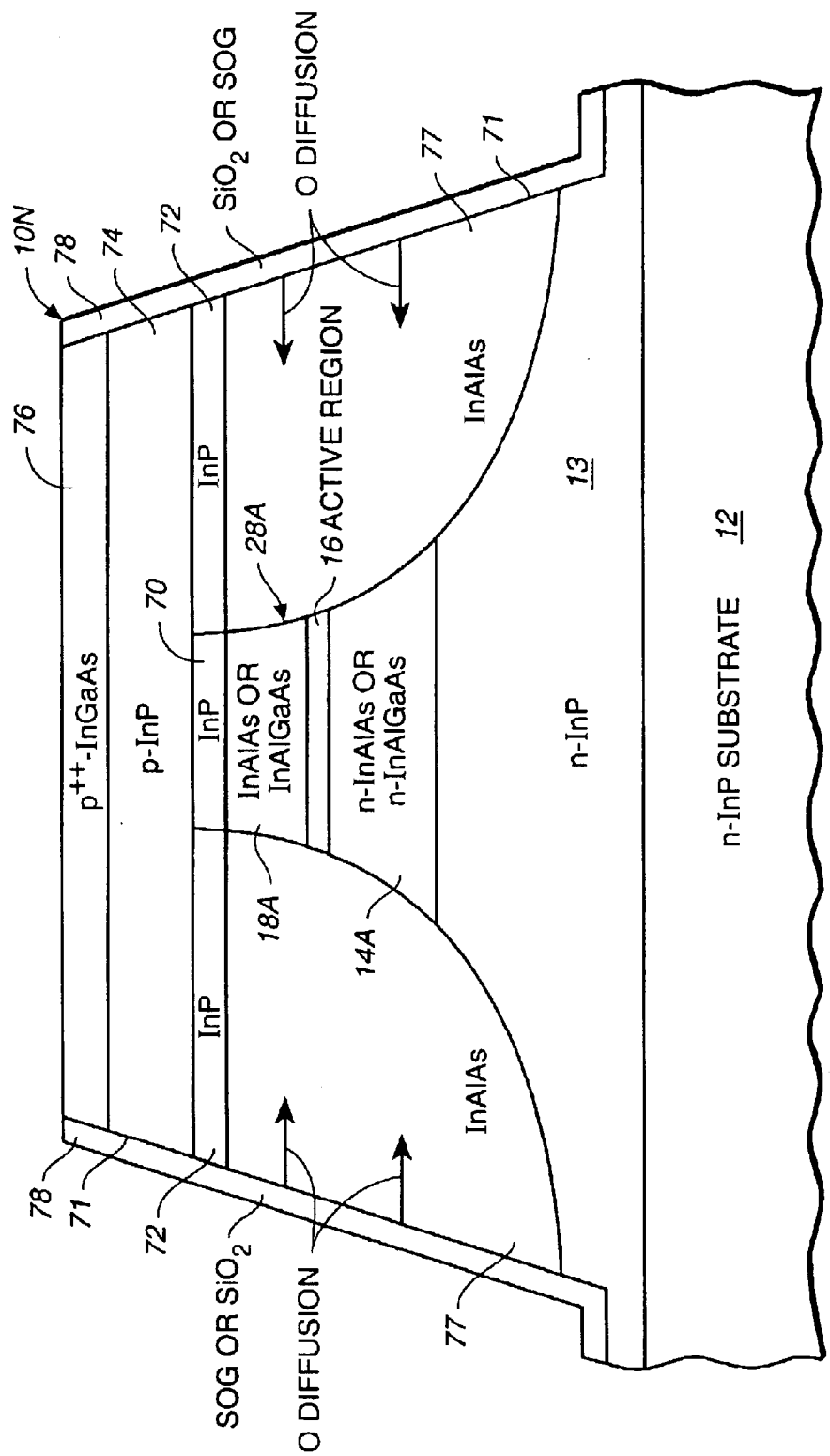
FIG._11

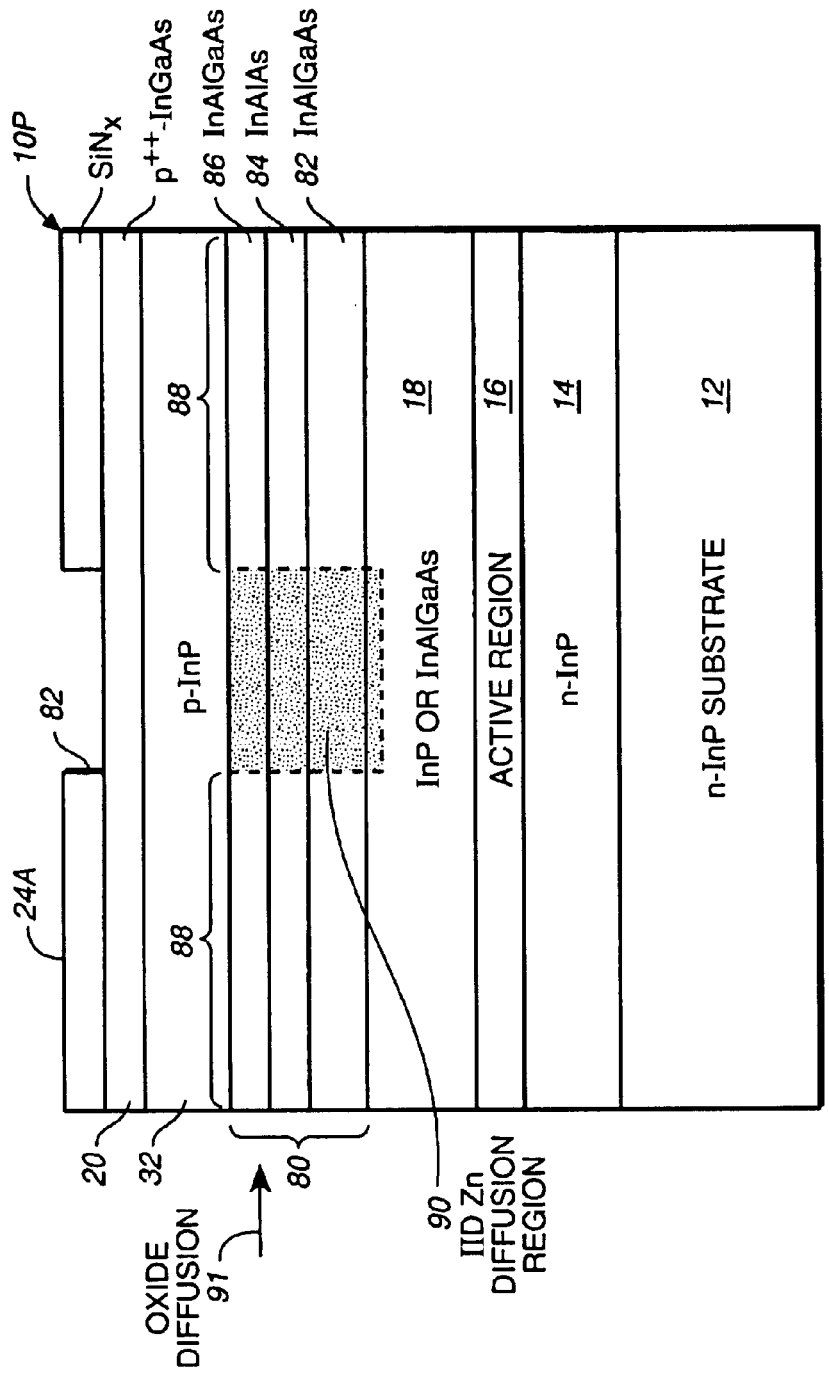
FIG._12

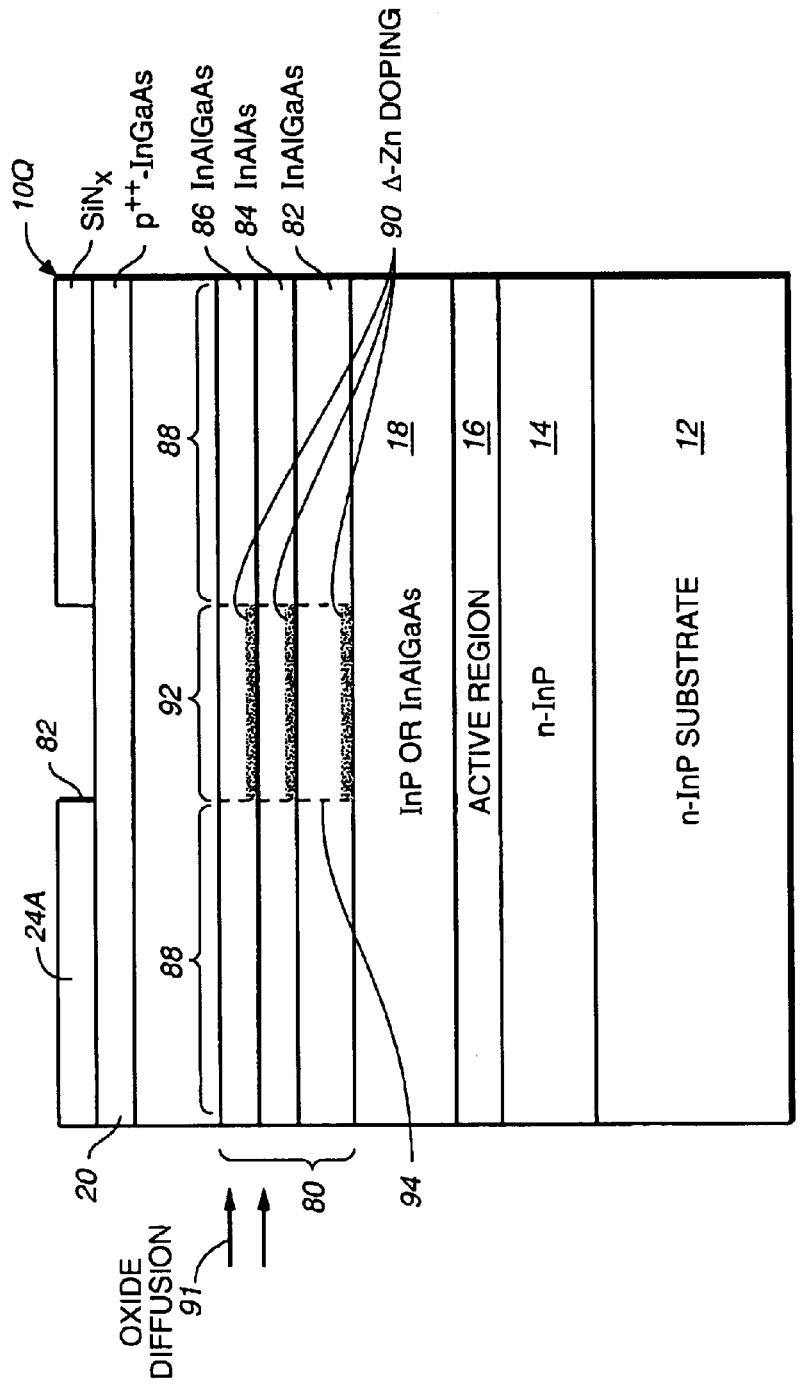
FIG._13

OXYGEN-DOPED AL-CONTAINING CURRENT BLOCKING LAYERS IN ACTIVE SEMICONDUCTOR DEVICES

REFERENCE TO RELATED APPLICATION

This application claims priority of provisional application, Ser. No. 60/340,319, filed Dec. 14, 2001, which provisional application is incorporated herein by its reference.

BACKGROUND OF THE INVENTION

1. Field of the Invention

This invention relates generally to active semiconductor devices, such as photonic, electronic or optoelectronic devices, and more particularly to buried heterostructure active devices, such as Group III-V buried heterostructure semiconductor lasers, LEDs, modulators, photodiodes, heterojunction bipolar transistors, field effect transistors or other active devices for preventing current flow through designated regions of the device, such as high resistance current blocking layers on adjacent sides of the active region of such devices to provide for current confinement to the active region to enhance device efficiency.

2. Description of the Related Art

It is well known in the art to provide blocking layers for current confinement to the active region in buried heterostructure (BH) lasers or other such semiconductor active devices employed, for example, as an optical transmitter source, modulator or optical amplifier in optical telecommunication systems. Such a BH device employs junction blocking or reverse bias layers or blocking junctions, such as combinations of p-InP/n-InP layers. An example of such a blocking layer combination is disclosed in U.S. Pat. Nos. 4,470,143 and 5,148,439. However, due to intrinsic capacitance, these types of blocking junctions may not be readily adaptable for bit rates higher than 2.5 Gb/s. The particular problem with respect to these types of blocking layers is that the reverse biased p-n blocking junction possess a significant junction capacitance, limiting the high speed characteristics of such devices. Also, the reverse biased p-n junction in these devices may possess leakage paths leading to high thresholds in the case of laser diodes as well as low quantum efficiencies in all such devices.

Another type of blocking layer is made semi-insulating through the addition of one or combinations of Fe, Co, Ni, as a dopant, for example, in AlGaInAs, AlInAs, InP or InGaAsP. In particular, Fe is employed as a high resistance blocking layer such as disclosed in U.S. Pat. Nos. 4,660,208 and 4,888,624. Combination layers of Fe doped InP layers with p or n doped InP layers may be employed as illustrated in European Patent Application No. 0314372. As illustrated in these patents and publications, InP:Fe layers are utilized as blocking layers in BH lasers for current confinement to the active region of a semiconductor active device. Other Group III-V alloys, such as, for example, InGaAsP:Fe, may be employed as a blocking layer as illustrated in U.S. Pat. No. 6,028,875. The use of Fe doped Group III-V blocking layers is a well established current blocking technology but plagued by problems. In particular, Fe doped layers have poor stability so that Fe readily diffuses into adjacent semiconductor layers or materials, particularly the active region of a device. This diffusion process can occur more particularly during subsequent high temperature processing steps. European Patent Application No. 0208209 suggests a solution to this problem with the provision of an undoped spacer layer formed between the active region and adjacent layers and a second-growth InP:Fe, current blocking layer. Such a spacer layer prevents contamination of the active region by the impurity Fe in the adjacent, high resistive current blocking layer since the spacer layer functions as a diffusion inhibitor. Also, the spacer layer is made thin so that the leakage current outside of the buried active region is small. However, there is no mention in this publication of what the material might be for such a spacer layer.

A more recent approach for providing resistive layers to function as current blocking layers has been reported by S. Bouchoule et al. in an article entitled, "New Buried Heterostructure using MOVPE Selective Regrowth of Semi-Insulating (SI-) InAlAs for Low Capacitance Optical Sources", *Proceedings of The 14$^{TH}$ Annual Meeting of the IEEE Lasers & Electro-Optics Society* (LEOS), La Jolla, San Diego, Calif., pp. 883–884, Nov. 14–15, 2001. SI-InAlAs layers were grown by MOVPE under growth conditions to obtain high resistivity with low capacitance and lattice matched to InP substrates. Under optimized conditions, a resistivity of $2 \times 10^7$ Ωcm was achieved. Similar results are reported in U.S. Pat. No. 5,679,603, in particular, in the discussion of embodiments 1–3 of that patent where the oxygen forms a deep donor level which is naturally taken into the crystal from residual oxygen and $H_2O$ in the MOCVD reactor and/or contamination of their source materials with oxygen utilized to growth Group III-V materials. Resistivity values of $5 \times 10^4$ Ωcm are indicated. However, for good quantum efficiencies with low current leakage, the resistivity required for the current blocking layer must be much higher than these values, preferably at least about $10^6$ to $10^7$ Ωcm or higher. U.S. Pat. No. 5,679,603 reports values in the range of a resistivity of $10^3$ Ωcm to $10^8$ Ωcm for InAlAs and indicates this to be a sufficiently high resistance compound semiconductor for current blocking layers. However, it would be desirable to obtain repeatable, maintained high resistivity values with even lower current leakage values in a narrow, upper resistivity range, e.g., about $10^6$ to $10^8$ Ωcm.

Generally, the resistivity for semi-insulating Group III-V or SI-III-V epitaxial growths can be achieved through background doping using low growth temperatures, such as below 550° C. As an example, in U.S. Pat. No. 5,804,840 to Ochi et al., high resistance or SI-InAlAs layers were achieved with growth temperatures of about 500° C. where background oxygen acts as a deep donor compensating the shallow acceptor, such as carbon, having a higher concentration than that of a shallow donor, such as background silicon. By controlling the relationship of deep and shallow donors and acceptors, a SI-layer, for example, of InAlAs, can be achieved. In this case, a resistivity "exceeding" $5 \times 10^4$ Ωcm was achieved, which is significantly lower than the desirability for a resistivity range of about $10^6$ to $10^8$ Ωcm or higher. The dependence on background doping levels in a reactor or other growth apparatus to achieve a desired level of resistivity is a difficult approach to form current blocking layers having uniform characteristics on continuous and repeatable fabrication basis. Background doping levels are a function of many variables, e.g., hydride source oxygen purity, metalorganic source purity, carrier gas purity, integrity of the vacuum seals in the MOCVD reactor, previously deposited materials within the confines of the MOCVD reactor chamber as well as on the susceptor, injector(s), etc. As a result, background doping levels can substantially vary from reactor run to reactor run, resulting in significant variations in the current blocking properties of the compounds and materials formed when utilizing this technique and approach.

U.S. Pat. No. 6,019,840 to Hartmann et al. does disclose SI-layers with resistances in the range of $10^9$ Ωcm for SI-InGaP lattice-matched to GaAs. However, the greater need is for materials lattice-matched to InP for producing light emitting devices emitting and functioning at wavelengths (e.g., 1270 nm to 1650 nm) suitable for optical telecommunication applications, such as InAlAs latticed-matched to InP. As previously indicated relative to U.S. Pat. No. 5,804,840, SI-InAlAs, via low growth temperatures and background impurities, does not provide sufficiently high resistive values or well controlled active semiconductor devices employed particularly in optical telecommunication applications where the active semiconductor devices are integrated as a photonic integrated circuit (PIC) with close device spacing encountered so that the highest achievable levels of low current leakage in such devices are required, e.g., resistivities in a range of about $10^6$ to $10^8$ Ωcm or more.

Studies of higher resistivity materials of InAlP lattice-matched to GaAs and InAlAs lattice matched to InP suggested the possibility of achieving high resistance or semi-insulating materials through intentional oxygen doping, such as indicated in the paper of J. C. Chen et al., "Effects of Trimethylindium on the Purity of $In_{0.5}Al_{0.5}P$ and $In_{0.5}Al_{0.5}As$ Epilayers Grown by Metalorganic Chemical Vapor Deposition", *Journal of Electronic Materials*, Vol. 6(4), pp. 362–365, 1997, although this paper was not directed to such intentional oxygen doping. The paper only relates to the study of background doping and impurities of carbon, silicon and oxygen. There has been increasing interest in intentional oxygen doping in MOCVD processing, as illustrated in the patent of U.S. Pat. No. 5,909,051 to Stockman et al., which teaches oxygen doping of p-type confinement layers (e.g. AlGaInP) in LEDs which improves device stability and, therefore, long term device reliability. Also in the case of AlGaInP lattice matched to GaAs, oxygen doping has been studied as indicated the paper of J. S. McCalmont et al., "The Effect of Oxygen Incorporation in Semi-Insulating $(Al_xGa_{1-x})_yIn_{1-y}P$", *Journal of Applied Physics*, Vol. 71(2), pp. 1046–1048, Jan. 15, 1992. In the case here, besides being lattice matched to GaAs, the source of oxygen was an $O_2$ flow into the reactor and not from an oxygen source, such as diethyl aluminum ethoxide (DEALO), which has been found to compensate silicon donors due to oxygen-induced multiple deep levels in InGaAs:Si:O. See the article of J. W. Huang et al., "Controlled Oxygen Incorporation in Indium Gallium Arsenide and Indium Phosphide Grown by Metalorganic Vapor Phase Epitaxy", *Journal of Electronic Materials*, Vol. 24(11), ($7^{TH}$ Biennial Workshop on Organmetallic Vapor Phase Epitaxy, Fort Myers, Fla., Apr. 2–5, 1995), pp. 1539–1546, November 1995. Also, previous mentioned U.S. Pat. No. 5,679,603 includes examples where the oxygen concentration in the crystal is controlled by the intentional doping of oxygen in AlInAs via an oxygen gas. However, in the embodiments reported, there is no indication of the resistivity levels except for the previously mentioned statement that high resistance semiconductor compounds fall in the range of $10^3$ to $10^8$ Ωcm. As indicated earlier, this large range is not acceptable for current blocking applications in demanding applications. Furthermore, using $O_2$ as an oxygen source has the disadvantage of pre-reacting with the Group III-V growth source materials in the MOCVD reactor chamber. These pre-reactions make the controlled incorporation of oxygen difficult and cause other detrimental problems such as undesired deposits in the reactor chamber and problems with composition or constituent control of the epitaxial deposition of Group III-V components comprising the compounds or layers that are being epitaxially grown in the reactor.

Still another approach for forming semi-insulating blocking layers is to employ lateral oxidation techniques such as disclosed in U.S. Pat. Nos. 5,262,360 and 5,400,354 by exposing Al-containing layers to a wet oxidation process to form a native oxide in such layers or a diffusion process where oxide layer is formed on the surfaces to be oxidized and diffusion of water molecules or oxygen occurs from the oxide surface layer into the aluminum-containing layers to form its native oxide. A similar method may also be employed herein to produce the novel devices contemplated by this invention. In the utilization of this native oxide processing, the lateral oxidation to form the native oxide of the aluminum-containing layers can be controlled so as not enter the defined current flow region by utilizing Al-containing blocking layers containing a higher Al mole fraction than the Al mole fraction of any of the layers formed in the current flow region so that the lateral oxidation can be easily terminated at the lower mole fraction Al-containing layers in the current flow region as taught in U.S. Pat. No. 6,201,264, or by forming a mesa or groove current confinement region where the Al-containing layers are stepped so that the oxidation extends only to layer step region as taught in U.S. Pat. No. 6,287,884. Both of these patents are incorporated herein by their reference.

OBJECTS OF THE INVENTION

It is an object of the present invention to provide a Al-III-V compound semi-insulating layer having high resistivity.

It is another object of this invention to provide Al containing current blocking layers intentionally doped with oxygen providing resistivities, for example, in excess of about $10^6$ to $10^8$ Ωcm, on a reliably repeatable basis.

It is another object of this invention to provide a Al-III-V compound semiconductor layer or region to InP that is employed as a current blocking layer or region in an active semiconductor device which has a higher and/or more controlled oxygen concentration in excess of that achieved by the flow of oxygen gas in a MOCVD or OMVPE reactor through the utilization of a low vapor pressure oxide source for the oxygen dopant.

It is further object of this invention to provide a current blocking layer that has a high concentration oxygen permitting the additional deep level doping of other impurities (e.g., Fe) into the same layer or into adjacent layers which will block the diffusion of these impurities into adjacent layers or into an adjacent active region of an active semiconductor device as well as preventing the in-diffusion of other dopants into the current blocking layer.

SUMMARY OF THE INVENTION

According to this invention, an Al containing group III-V compound semi-insulating layer is formed during MOCVD growth using an oxygen source to from a current blocking layer or region that defines a current channel or region in an active semiconductor device, such as a buried heterostructure semiconductor lasers, LEDs, modulators, photodiodes, heterojunction bipolar transistors, field effect transistors or other active devices and for preventing current flow through designated regions of the device.

An important aspect of this invention is the provision of current blocking layers that are formed from intentional oxygen doping during their epitaxial growth. The deployment of intentional oxygen doping provides for better control and greater oxygen incorporation during layer growth over a wider range of growth parameters so that higher, repeatable resistivity values can be achieved under those conditions, such as $10^{6-8}$ Ωcm or higher. These current blocking layers particularly contained Al and are lattice matched to the substrate, such as InAlGaP latticed matched to GaAs or InAlGaAs latticed matched to InP. The oxygen doping may be provided via an $O_2$ flow into the MOCVD reactor or provided via an oxide source where the oxide is cracked, i.e., the oxygen is dissociated from other gas constituents. However, an oxide source is preferred over an $O_2$ gas source because the latter provides a higher cracking temperature and reduced pre-reactions as described earlier. The preferred source for intentional oxygen doping is with a low vapor pressure oxide source such as, for example, a nitrogenous oxide ($NO_x$) or dialkylaluminum aloxides or diethyl aluminum alkoxide (DEALO). An ideal oxygen source is one that has a low cracking temperature without any tendency of pre-acting in the reactor with other source constituents prior to epitaxial wafer deposition. The material regime of particular interest is InAlAs/InP for achieving wavelengths of interest in optical telecommunication systems. Instead of InAlAs:O as a blocking layer material, InAlGaAs:O or AlGaAsSb:O or alternating layers of or alternating monolayers of AlAs:O/InAs or AlGaAs:O/InAs or InAlGaAs:O/InAs may be utilized or substitute InGaAs, InAlAs, InGaAsP for any of the InAs layers here. Also, combinations of the ternary layers and the quaternary layers may be employed, such as alternating layers of InAlAs:O and InAlGaAs:O. In the case of all the embodiments disclosed in this application, Fe can be co-doped with O since the oxygen at donor sites provides a strong holding bond for the out-diffusion of Fe from the material as well as prevention of the in-diffusion of other dopants, such as Zn, into the formed current blocking layer. Furthermore, O-doped layers can bond other layers with mobile elements (e.g., Fe) to prevent the indiffusion or out-diffusion of impurities into or out of these layers.

It should be understood that with respect to the foregoing Al-containing Group III-V blocking layer materials, there is no Group V phosphor or P. However, it is within the scope of this invention that small amounts of P can be present in these Al-containing Group III-V blocking layer materials.

To enhance the effect of oxygen doping of the Al-III-V current blocking layer or region and the resulting resistivity level, the Al content in the deposited layer is preferably 0.5 mole fraction or greater.

In another embodiment of this invention, the current confining channel of the active semiconductor device may be a plurality of Al containing layers formed adjacent to the active region with a current channel formed through the Al containing layers by means of impurity induced disordering (IID) or vacancy induced disordering (VID). Regions of the deposited Al containing layers adjacent to the disordered current channel region are laterally oxidized from a water vapor source to form an Al-bearing native oxide defining current blocking regions on adjacent sides of the disordered current channel region. An example of such a device material regime is an InP substrate with Al containing layers comprising or InAlGaAs or alternating layers of InAlAs and InAlGaAs.

Another feature of this invention is the inclusion of an active semiconductor device in a photonic integrated circuit (PIC) of the type disclosed in U.S. patent application, Ser. No. 10/267,331, filed Oct. 8, 2002 and published on May 22, 2003 as Pub. No. 2003/0095737, which nonprovisional application is incorporated herein by its reference.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is schematic side view of a first embodiment of this invention.

FIG. 2 is a schematic side view of a second embodiment of this invention.

FIG. 3 is a schematic side view of a third embodiment of this invention.

FIG. 4 is a schematic side view of a fourth embodiment of this invention.

FIG. 5 is a schematic side view of a fifth embodiment of this invention.

FIG. 6 is a schematic side view of a sixth embodiment of this invention.

FIG. 7A is a schematic side view of a seventh embodiment of this invention.

FIG. 7B is a schematic side view of a first modified version of the seventh embodiment of this invention.

FIG. 7C is a schematic side view of a second modified version of the seventh embodiment of this invention.

FIG. 8 is a schematic side view of a eighth embodiment of this invention.

FIG. 9A is a schematic side view of a ninth embodiment of this invention.

FIG. 9B is a schematic side view of a modified version of the ninth embodiment of this invention.

FIG. 10 is a schematic side view of a tenth embodiment of this invention.

FIG. 11 is a schematic side view of an eleventh embodiment of this invention.

FIG. 12 is a schematic side view of a twelfth embodiment of this invention.

FIG. 13 is a schematic side view of a thirteenth embodiment of this invention.

DETAILED DESCRIPTION OF THE INVENTION

Reference is now made to FIG. 1 illustrating the first embodiment of this invention in a generally generic form. Active semiconductor device 10A may be, for example, any such semiconductor device that is rendered operative through the establishment of a current channel through the device, such as, a semiconductor laser diode, semiconductor optical amplifier (SOA), LED or EA modulator, just to name a few such devices. Device 10A comprises a substrate 12, for example, n-InP, upon which is grown lattice-matched or pseudomorphic strained active layer or layers comprising active region 16. To provide for carrier recombination under applied bias conditions, Group III-V epitaxially grown layers may be provided with an n-type dopant, such as Si or S, or with a p-type dopant such as Zn or Mg, as is well known in the art. Substrate 12 could also be GaAs but for wavelengths useful in present optical telecommunication systems, the preferable material system for these devices are InP material systems, such as, but not limited to, InGaAsP/InP.

Device 10A, as well as most other embodiments of this invention, involves a multi-step growth process employing metalorganic chemical vapor deposition (MOCVD), also known as or organometallic vapor-phase epitaxy (OMVPE) which is well known in the art as documented by Professor Stringfellow in his book entitled, *Orgaometallic Vapor-Phase: Theory and Practice*, 1999, Academic Press. As a specific example, in the first growth process, a buffer layer (not shown) may be grown on substrate 12 followed by the growth of a confinement layer 14 of n-InP, such as doped with Si or S. Next, an active region 16 is grown. Active region may be a single layer or multiple layers or a plurality of quantum well (QW) layers. For example, active region 16 may be InGaAsP or a plurality of quantum wells and barriers of different mole fractions of InGaAsP lattice matched to substrate 12 or pseudomorphic strained as is known in the art. These layers include separate confinement layers with a bandgap lower than the adjacent confining region but higher than layers in the active region that are responsible for the emission or absorption of light. These layers or region provide carrier confinement and/or favorable waveguiding characteristics and are well known in the art. The growth of active region 16 is followed by the growth of confinement layer 18 of p-InP, such as with Zn or Mg as the p-type dopant. At this point in time in the MOCVD process, the first growth processing is completed and a selective etch is then performed on the InP wafer via an $SiO_2$ or SiN mask through the use of patterned photolithography. The etch is performed backed to the region of substrate 12 or n-InP containing layer 14 employing, for example, a dry etching process, reactive ion etching (IRE) or plasma enhance reactive ion etching (PE-IRE), forming a ridge or mesa structure 28 (comprising epitaxial layers 14, 16 and 18) in regions covered by the mask as illustrated in FIG. 1. The etch may alternatively comprise a wet chemical etch process. The mask can then be retained for the second growth process with MOCVD wherein a high resistance Al-containing Group III-V layer 30 (hereinafter referred to as Al-III-V) is epitaxially deposited. Layer 30 functions a current blocking layer to limit the primary flow of applied current through device 10A through mesa 28 which defines a current confinement channel for device 10A.

As previously mentioned in the background, Al-III-V layer 30 may be grown as an in-situ, non-doped layer due to background doping, such as from background hydrogen, carbon and oxygen due to sources of contamination in the epitaxial process, such as from sources providing the growth material gases to the MOCVD process, or due to leaks or deposits in the reactor from past runs in the reactor itself. This type of background doping, therefore, is not controllable since the resulting resistance of the layer depends on the previous growth history, the particular background doping available from growth to growth in the reactor as well as particular growth conditions, particularly temperature, which is conducted at a low temperature compared to the higher growth temperatures in the epitaxial deposition of other semiconductor Group III-V layers of device 10A. Moreover, consistently high resistance values to achieve the lowest values of current leakage are not obtainable by means of this approach. A better approach is to intentionally dope rather than depend upon unintentional doping via the MOCVD reactor, i.e., via background doping or related schemes in an attempt to achieve desired background doping levels which are not reliable or stable from growth to growth.

As also mentioned in the background, others have employed Fe doped Al-III-V for SI, current blocking layer 30. However, Fe has high mobility in the as-grown material and has a high tendency to migrate into other adjacent layers of the as-grown structure, such as the mesa structure 28, thereby changing the layer conductivity property or quantum efficiency which is, of course, not desirable. In addition, dopants from the mesa structure 28 may also outdiffuse into the Al-III-V:Fe layers, which will degrade device performance. We intentionally dope layer 30 with oxygen to form the current blocking layer. Oxygen, in particular, provides a diffusion block against the diffusion of other dopants either into or through current blocking layer 30 and also render the material of layer 30 semi-insulating (Si) so that effectively no current flow will exist through this region. The oxygen dopant retards or restricts the diffusion of dopants and/or other crystal point defects which can result in deleterious effects on device performance. Thus, as will be seen in later embodiments, the codoping with Fe:O in Al-III-V compounds, such as InAlAs, provides for tying up Fe from diffusing out of current blocking layer 30 as well as preventing the in-diffusion of other dopants, such as Zn which has high volatility for diffusion, into blocking layer 30. Thus, the use of oxygen as a dopant to form for a high resistivity layer 30 significantly retards the diffusion of impurities, such as Zn or Fe and/or other crystal point defects into or out of current blocking layers 30. As a result, a spacer layer, as taught in the prior art previously mentioned in the background, is not required or necessary, i.e., the current blocking layer 30 may be in direct contact with mesa 28 as shown in FIG. 1. In other words, it is possible to eliminate the requirement for any separation or spacer layer between mesa 28 and current blocking layer 30.

While the prior art cited in the background discussed the use oxygen doping, the source generally employed is oxygen gas ($O_2$). This type of source does not provide good oxygen incorporation in a continuous and controlled manner. It is preferred that a low vapor pressure oxygen source, such as, nitrogenous oxide ($NO_x$) or diethyl aluminum ethoxide (DEALO) be employed for best controlled results to achieve the highest, consistent levels of oxygen incorporation at deep level donor sites in the bandgap of the blocking layer material.

Referring now again to the description of FIG. 1 and the completion of device 10A, after the growth of the current blocking layers 30 and removal of the $SiO_2$ or SiN etch mask, the active semiconductor device 10A is completed by the growth of an additional cladding layer 32 of p-InP followed by a cap or contact layer 20, such as $p^{++}$-InGaAs. A metal contact 22 is formed in a $SiO_2$ passivation layer 24, comprising, for example, AuZn under Au, which is aligned with mesa 28, all of which is well known in the art. The device is completed with a bottom contact 26 comprising, for example, AuGe under Au as is known in the art.

It should be noted that in the case of the embodiment of FIG. 1 as well as in all other embodiments, the oxygen doped current blocking layer or layers may include other conductivity type dopants, such as Zn or Mg in the case of p-type, or Si or S in the case of n-type, and/or other SI-dopants such as Fe, Co, Ni or Ti. A principal feature of this invention is the deployment of oxygen for high resistivity, insulating current blocking layer(s), taking advantage of the strong bonding properties of oxygen to hold these other dopants and/or crystal point defects, whether of the insulating type or of the conductivity type, from out-diffusing from the oxygen doped layer(s) or in-diffusing into the oxygen doped layers.

Reference is now made to FIG. 2 which discloses a second embodiment of this invention. In this embodiment as well as in all subsequent embodiments, the previous description relative to elements and components in FIG. 1 equally apply to all of the same elements and components having the same numerical identification in figures of the subsequent embodiments. FIG. 2 is the same as FIG. 1 except there is, in addition, the deposited layers 34 and 36 between which is formed current blocking Al-III-V layer 30. These layers 34 and 46 are optionally added in the case where, for example, the close proximity of the Al-III-V:O layer to the mesa 28 or active region 16 may induce deleterious device effects (e.g., high interface recombination). In these cases, it may be desirable to set-back the Al-III-V:O layer with a layer of InP or InP:O. This layer should be in the range of about 100 Å to 2 $\mu$m thick, preferably about 500 Å to 5,000 Å thick. In the case of layer 34, this lower set-back layer may comprise InP, InGaAs or InGaAsP that is doped n-type, unintentionally doped, oxygen doped, or any combinations thereof. Likewise, for layer 36, this upper set-back layer may comprise InP, InGaAs or InGaAsP that is doped n-type, p-type, unintentionally doped, or oxygen doped. Upper set-back layer 36 provides the utility of an Al-free cap layer after the growth of the current blocking layer. Without this Al cap layer 36, the underlying, exposed Al-III-V layer would form a "hard" oxide at its surface making it extremely difficult to grow high-quality single crystal material on this layer. Thus, cap layer 36 prevents the formation of such a "hard" oxide since all of the Al containing layers are buried and facilitates subsequent processing and regrowth of layers 32 and 20. It is essential that cap layer 36 bury or cover all Al-III-V material originally existing at the growth surface. This is true relative to subsequent embodiments herein as shown in FIGS. 3–9. The sandwiching layers 34 and 36 may be respectively doped to form added current blocking properties, such as a reverse biased junction as is known in the art.

Reference is made to FIG. 3 illustrating a third embodiment of this invention comprising the same layers as shown in FIG. 2 except that here, the material of choice for current blocking layer 30 is InAlAs:O sandwiched between layers 34A and 36A of n-InP and p- or n-InP, respectively. Alternatively, layer 36A can be doped as InP:O. While InAlAs:O is illustrated in this embodiment for blocking layer 30, it should be understood that blocking layer 30 may also be InAlGaAs:O or alternating layers or monolayers of AlAs:O/InAs, the latter of which will be described in more detail later, such as relative to the embodiment shown in FIG. 6.

Reference is now made to the fourth embodiment comprising this invention shown in FIG. 4. Active semiconductor device 10D is the same as that in the embodiment of FIG. 3 except that current blocking layer 38 is co-doped with oxygen (O) and iron (Fe) to provide enhanced current-blocking characteristics. Both of these dopants are deep level impurities and, in combination, the O donors do not allow any Fe mobility as well as any mobility for impurity in-diffusion by other dopants such as Zn. While InAlAs:O:Fe is shown in this embodiment, it should be understood that layer 38 may also be InAlGaAs:O:Fe or alternating layers or alternating monolayers of AlAs:O:Fe/InAs. It should be noted that the presence of Fe as an additional deep level impurity can be provided relative to any of the embodiments of this invention. Note that the controlled introduction of oxygen from an oxide source is suitable for this embodiment. In order to incorporate high levels of active Fe, specific growth conditions are required such as, for example, higher growth temperatures. These conditions are not necessarily consistent with the incorporation of high levels of oxygen from the background. Thus, intentional oxygen doping can enable simultaneously high levels of both active Fe and O in the current blocking layers. Boundary layer 34B may be comprised of InP, InGaAs or InGaAsP and O-doped and undoped (unintentionally doped) or n-doped or combinations thereof, and boundary layer 36B may be comprised of InP, InGaAs or InGaAsP and O-doped and undoped (unintentionally doped) or n-doped or p-doped or combinations thereof.

Reference is now made to the fifth embodiment shown in FIG. 5 illustrating active semiconductor device 10E. This embodiment is the same as the previous embodiment of FIG. 4 except that a pair of current blocking layers 40 and 42 is employed and upper boundary layer 36A may be n-InP or n-InP:O where the latter prevents indiffusion or outdiffusion of impurities or crystal point defects. In the case here, one of the two layers 40 and 42 carries more Al content than the other layer in a set of layers 40, 42. For example, layer 40 may be comprised of $In_xAl_{1-x}As:O$ and layer 42 comprises $In_yAl_{1-y}As:O$ where x>y and preferably x may be greater than about 0.5 (Al-rich). The Al-rich alloy layer 40 provides for heightened concentration of oxygen in the grown crystal while the $In_yAl_{1-y}As$ layer 42 provides strain balance or lattice matching to InP substrate 12. Note that either layer 40 or 42 may be Al-rich. Furthermore, it is only critical that the Al-rich layer be oxygen doped. Thus, in the case here, layer 42 need not be doped.

In the sixth embodiment shown in FIG. 6, device 10F is the same as that device shown in FIG. 5 except that there are multiple Al-rich alloy layers 40 interposed with other Al containing layers 42. For example, alternate layers 40 may be comprised of $In_xAl_{1-x}As:O$ and alternate layers 42 are $In_yAl_{1-y}As:O$ where x>y and preferably x may be greater than about 0.5. These layers are preferably pseudomorphic or strain compensated. Such a current blocking layer combination provides a high resistance, SI-region with very little current leakage.

In both embodiments of FIGS. 5 and 6, layers 40 and 42 are very thin layers. The InAlAs layers 42 provide for strain balance or compensation relative to the Al-rich layers 40 that will not be lattice matched to InP. Thus, layers 40 and 42 are only grown to a thickness not to exceed the critical thickness, i.e., the thickness does not exceed the point where threading dislocations appear in the material. The strain compensating layers 42 relax the lattice strain brought about by the lattice mismatched, Al-rich layers 40. As an example, the strain compensating layers 42 may be $In_{0.7}Al_{0.3}As$: and the Al-rich layers 40 may be $In_{0.3}Al_{0.7}As:O$. The thickness of layers 40, 42 may roughly be in the range about 30 Å to about 1,000 Å, depending upon their compositional mole fractions of the layer constituents.

As stated previously, only the Al-rich layer or layers 40 are required to be O-doped. Furthermore, the position of layers 40 and 42 may be interchanged. Also, in the embodiment of FIG. 6, spacer layers are arbitrary lattice matched or pseudomorphic material may be placed between each pair of layers. Note that in the employment of FIG. 6, Fe-doping may be utilized in the Al-rich or Al-poor layers 40 and 42, respectively, for enhanced current blocking characteristics, i.e., $In_xAl_{1-x}As:O:Fe$ and/or $In_yAl_{1-y}As:O:Fe$. In this connection, it should be further noted that not all of the layers need to have the same Fe-doping level. For example, it may be desirable to have the outmost layers free of Fe. A further extension of the embodiments of FIGS. 5 and 6 is to utilize InAlGaAs layers for InAlAs layers 40 and 42. Note that the lower Al-content layers, such as layers 42, may contain no aluminum all; for example, they may be InGaAs.

FIG. 7A illustrates a further embodiment of the structure shown in FIG. 3 except in active semiconductor device 10G of FIG. 7A, multiple alternate layers are employed where layers 44 may be InAlAs:O or InAlAs:O:Fe and layers 46 may be InAlAs:O or InAlAs:O:Fe. In this example, the Fe-doped layers may or may not be co-doped with oxygen. Also, Fe may be placed with any deep-level mobile impurity. Furthermore, the Group III-V alloy that is Fe-doped may be InP, InGaAs, InGaAsP or InAlGaAs beside InAlAs. The purpose of the oxygen co-doping is to retard the movement of deep-level impurities and/or enhance the current blocking capabilities of the layers. The adjacent O-doped layers serve to further impede any out-diffusion or in-diffusion of impurities into the Fe or other deep-level impurity doped blocking layer. In this respect, a preferred embodiment would be to utilize InAlAs:O boundary layers that bound a core comprising an InAlAs (or InP):Fe layer or an InAlAs (or InP):Fe:O layer. This device 10H is shown in the modified embodiment of FIG. 7B relative to core layer 44. Note that it may be possible to omit the upper layer 46 above layer 44 or, alternatively, layer 36A or both layers 44 and 36A. One could omit one or both of these layers provided that out-diffusion or in-diffusion to or from p-InP layers 32 or 18 is not problematic.

Also, in order to eliminate upper boundary layer 36A, layer 44 (or layer 46, if present) should not contain sufficiently high Al content to form a "hard" oxide upon exposure to O-doping, as previously described. An example of this embodiment is device 10I shown in FIG. 7C where layer 44 is InP:Fe or InP:Fe:O.

In any of these embodiments shown in FIGS. 7A, 7B or 7C, InAlGaAs may be substituted where InAlAs is utilized in layers 44 or 46. Also, in connection with these layers 44 or 46, there may be ten or more alternating layers of InAlAs: Fe[O] and InAlAs:O. Furthermore, layers 44 may be Al-rich layers such as $(Al_xGa_{1-x})_yIn_zAs:Fe[O]$ and layers 46 are $Al_{x'}Ga_{y'}In_{z'}As:O$ where x>x'. Optionally, layers 44 may also be co-doped with an n- or p-type impurity or impurities.

FIG. 8 illustrates a further embodiment comprising active semiconductor device 10J where the current blocking layers in device 10J are modulated alloy layers 48 which may be alternating layers or alternating monolayers of AlAs:O/InAs or AlGaAs:O/InAs or InAlGaAs:O/InAs. It is desirable to utilize these layers where high oxygen content is required. Thus, not all O-doped layers in device 10J need to contain these alternating layers. Also, any of these layers may also be doped or co-doped with Fe.

FIG. 9A illustrates a further embodiment comprising active semiconductor device 10K where the current blocking layers do not contain an Al-content layer as is the case of all of the previous embodiments. In the case here, the non-Al containing material comprises InP doped with oxygen, The bond of oxygen atoms to InP, however, is not as strong as the bond of oxygen atoms with aluminum atoms in Al-III-V compounds. As a result, the insulating properties are not as good either, i.e., the achievable resistivity will not be as high. However, these O-doped layers may still provide reasonable ability for impeding the out-diffusion or in-diffusion of impurities or crystal point defects. Such a device 10K has utility where Al-III-V compounds are not desired in the fabrication of the active semiconductor device.

Active semiconductor device 10K comprises a current blocking region 50 of oxygen doped InP:O or InP:O:Fe sandwiched between blocking current confinement layers 34A and 52 respectively comprising n-InP and n-InP or n-InP:Fe. It should be noted that bottom boundary layer 34A is optional. Moreover, upper boundary layer 52 can also be doped with Fe to provide additional resistance to current flow in combination with current blocking layer 50. Also, since layer 50 is doped with O, the out-diffusion of Fe into the layers in mesa 28 will be minimized. Alternatively, one can utilize InP:O boundary layers to impede the out-diffusion of sandwiched Fe-doped layers. Such a modified structure is shown in FIG. 9B comprising active semiconductor device 10L. In the structure here, layers 50 are InP:Fe or InP:Fe:O and outer layers 49 and 53 of the blocking region are InP undoped or n-doped. These outer layers 49 and 53 are optional. Layers 51 of InP:O are also optional in the case where layer 50 is co-doped Fe:O. In any case, the boundary layers 51 of doped O-InP help prevent the out-diffusion of Fe from layer 50.

The foregoing embodiments are oxygen doped preferably with a low vapor pressure oxide source, such as DEALO. It is also possible to prepare the oxygen-diffuse current blocking layers by means of the wet oxide approach as mentioned in the background section or from a deposited layer comprising an oxide layer as a diffusion source for oxygen to form a native oxide. Embodiments employing these types of sources for semiconductor active devices are illustrated in FIGS. 10–12.

In FIG. 10, active semiconductor device 10M is similar to the structure shown in FIG. 3 except that the oxygen doping of Al-containing, current blocking layer 30 is brought about by native oxide diffusion. In the case here, at least after the deposition of cladding layer 32 of p-InP in the second epitaxial growth process, trenches 60 are formed by selective etching after which a wet-oxidation process is applied, as is known in the art. Then, as taught in U.S. Pat. No. 5,262,360 to Professor Holonyak and associates and other later patents dealing with this process, which patent is incorporated herein by their reference, a wet oxide process is conducted, such as by bubbling nitrogen through $H_2O$. As a result, layer 30 is transformed into its native oxide by lateral diffusion via trenches 60. Core layer 30 may, for example, be InAlAs, AlGaAs or AlAs.

Reference is now made to the embodiment shown in FIG. 11 comprising active semiconductor device 10N which comprises a substrate 12 of n-InP upon which is deposited in a first growth process the following layers: n-InP buffer layer 13; confining layer 14A of n-InAlAs or n-InAlGaAs; active region 16, such as InGaAsP or multiple quantum wells and barriers of InGaAsP; confining layer 18A of p-InAlAs or p-InAlGaAs; and InP layer 70 to protect the underlying Al containing layer 18A from oxidation when the device is removed or otherwise exposed to the ambient prior a second growth process. The surface of the wafer containing device 10N is then covered with a $SiO_2$ or $SiN_x$ mask layer, which is patterned via photolithography as is known in the art. The exposed portions of the photolithographic pattern are removed and an etching process is performed in the exposed regions to produce troughs 60, as in the case illustrated in FIG. 10, employing an anisotropic dry etching process such as reactive ion etching (IRE) or plasma enhance reactive ion etching (PE-IRE), forming a ridge or mesa structure 28A (comprising epitaxial layers 14A, 16 and 18A), as shown in FIG. 11. This is followed with the performance of the second epitaxial growth process and the deposition of current blocking layer 77 comprising a Al-containing layer, such as, for example, InAlAs, followed by the epitaxial growth of protection layer 72 of InP, cladding layer 74 of p-InP and cap or contact layer 76 of $p^{++}$-InGaAs. Layer 77 can be a Al-rich InAlAs layer where the Al content in the layer is greater than 0.5 mole fraction. Next, trenches 71 are formed in the regions of the second growth between mesas 28A of adjacent devices 10N in the wafer employing a mask and selective etching process as known in the art. This is followed by the formation of an oxide source layer 78 on InAlAs layer 77, such as SiO$_2$ or spin-on-glass (SOG) which is deposited in troughs 71 employing sputter or other such process to form this layer on the side surfaces of troughs 71. This is followed further by a heat treatment process where an oxide diffusion is generated from layer 78 forming an oxide of InAlAs in layer 77. The temperature of such a process may be, for example, around 750° C. This oxide process may proceed through layer 77 to mesa 28A. On the other hand, additional control can be achieved by forming Al-rich layer 77, i.e., more than 0.5 mole fraction of Al, so that the native oxide of layer 77 is readily formed without oxidizing the Al containing layers within mesa 28A.

FIG. 12 shows the twelfth embodiment of this invention where active semiconductor device 10P comprises a fabricated planer structure rather than a ridge or mesa structure. In the case here, a n-InP wafer is provided upon which is epitaxially grown the following exemplifying layers: n-InP confining layer 14, active region 16 such as InGaAsP, a confining layer 18 of InP or InAlGaAs, a group 80 of layers 82, 84, 86 respective, for example, of InAlGaAs, InAlAs and InAlGaAs where at least one of these layers is Al-rich for purposes of conversion to a high native oxide content , a p-InP layer 32 and cap layer 22 of p$^{++}$-InGaAs. SiO$_2$ SiN$_x$ layer 24 provides a mask for performing impurity induced disordering (IID) via opening 82 formed in mask 24A, which opening later receives a metal contact. IID is taught in U.S. Pat. Nos. 4,378,255; 4,594,603; 4,511,408 and 4,639,275, all of which are incorporated herein by their reference. Next, either by trenching or by dicing into chips, the lateral side surfaces of layer group 80 are exposed to an oxide source treatment, as discussed in the preceding embodiments of FIG. 10 or 11, to form Si-layers through native oxide formation in regions 88 of the group 80 of layers 82, 84, 86 via the oxide diffusion 91. The advantage of the pre-formed IID region 90 is that the diffusion of Zn in this region interdiffuses the Al containing layer constituents, as is known in the art, and functions, in part, as a barrier to oxygen diffusion extending from regions 88 into region 90, i.e., the oxidation proceeds through regions 88 but not significantly into the interdiffused region 90 because the Al-containing layers 82, 84, 86 have been disordered via IID to render region 90, as disordered, generally more Al-poor compared to non-disordered regions 88. Thus, region 90 is substantially resistant to oxidation compared to oxidized regions 88 so that region 90 functions as a current channel to active region 16 of device 10P.

An alternative approach to the IID Zn diffusion region 90 in FIG. 12 is shown in FIG. 13, where the active semiconductor device 10Q is the same as device 10P in FIG. 12 except that selective delta doped regions 90, such as with zinc delta-doping, are formed relative to each of the layers 82, 84, 86, via masking during epitaxial growth to form a interdiffused region 92 upon subsequent annealing after completion of device growth. Region 92 is substantially resistant to oxidation compared to subsequently oxidized regions 88 because, in region 92, layers 82, 84, 86 have been disordered so that the overall Al content of the disordered layers in this region have low Al content compared to at least one of the same layers in regions 88. The annealing temperature to form this diffusion may be, for example, around 850° C. This is followed by the oxide diffusion employing, for example, a wet oxide treatment, illustrated at 91. The conversion to native oxide of layers 82, 84, 86, via the oxide diffusion 91, will significantly terminate at the interface 94 of these layers formed between regions 88 and region 92 due to the previously preformed IID treatment in region 92.

While the invention has been described in conjunction with several specific embodiments, it will be evident to those skilled in the art that many further alternatives, modifications and variations will be apparent in light of the foregoing description. For example, instead of InAlAs:O current blocking layers, they can also be comprised of AlGaAsSb or (AlGaIn)AsSb. Thus, the invention described herein is intended to embrace all such alternatives, modifications, applications and variations as may fall within the spirit and scope of the appended claims.

What is claimed is:

1. An active semiconductor device comprising:

a plurality of semiconductor layers formed on a substrate;

an active region included within said layers;

a current channel formed through this active region defined by a plurality of current blocking layers formed on adjacent sides of said active region channel;

said blocking layers comprising a plurality of aluminum-containing III-V compound layers doped with oxygen or doped with both oxygen and iron;

at least one of said aluminum-containing III-V compound layers has either a higher aluminum content or is a different aluminum-containing III-V compound than at least one of said other aluminum-containing III-V compound layers or both.

2. The active semiconductor device of claim 1 wherein said at least one aluminum-containing III-V compound layer is doped with oxygen from a low vapor pressure oxide source during its growth.

3. The active semiconductor device of claim 2 wherein said oxide source is nitrogenous oxide (NO$_x$) or diethyl aluminum ethoxide (DEALO).

4. The active semiconductor device of claim 1 wherein said aluminum-containing III-V compound layers are selected from the group consisting of InAlAs:O, InAlGaAs:O or monolayers of AlAs:O or AlGaAs:O or InAlGaAs:O alternated with InAs.

5. The active semiconductor device of claim 1 wherein in said blocking layers are sandwiched between a pair of setback layers.

6. The active semiconductor device of claim 5 wherein said setback layers are non-aluminum-containing semiconductor layers.

7. The active semiconductor device of claim 6 wherein said non-aluminum-containing semiconductor layers are InP, InGaAs or InGaAsP.

8. The active semiconductor device of claim 6 wherein said setback layers are of the same or opposite conductivity type.

9. The active semiconductor device of claim 7 wherein said non-aluminum-containing semiconductor layers are doped with oxygen.

10. The active semiconductor device of claim 1 wherein said at least one higher aluminum content Group III-V compound layer has an aluminum mole fraction content greater than 0.5.

11. The active semiconductor device of claim 1 wherein said aluminum-containing Group III-V compound layers are alternated with non-aluminum-containing layers.

12. The active semiconductor device of claim 11 wherein said non-aluminum-containing layers are InP.

13. The active semiconductor device of claim 12 wherein said InP layers are doped with oxygen or doped with oxygen and iron.

14. The active semiconductor device of claim 1 wherein said aluminum-containing III-V compound layers are doped with Ti:O instead of O or Fe:O.

15. The active semiconductor device of claim 14 wherein said aluminum-containing III-V compound layers are selected from the group consisting of InAlAs, InAlGaAs or monolayers of AlAs or AlGaAs or InAlGaAs with InAs.

16. The active semiconductor device of claim 15 wherein in said aluminum-containing III-V compound layers are sandwiched between a pair of setback layers.

17. The active semiconductor device of claim 16 wherein said setback layers are non-aluminum-containing layers.

18. The active semiconductor device of claim 17 wherein said non-aluminum-containing setback layers are InP.

19. The active semiconductor device of claim 18 wherein said InP layers are of the same or opposite conductivity type.

20. The active semiconductor device of claim 1 wherein said device comprises a buried heterostructure semiconductor laser, LED, modulator, photodiode, heterojunction bipolar transistor or field effect transistor.

21. The active semiconductor device of claim 1 wherein said active region is a single active layer, a plurality of standard or strained quantum well layers.

22. The active semiconductor device of claim 21 wherein said active layer or layers are comprised of InGaAlP.

23. A photonic integrated circuit (PIG) comprising an active semiconductor device as set forth in claim 1.

24. An active semiconductor device comprising:
a plurality of semiconductor layers formed on a substrate;
an active region included within said layers;
a current channel formed through this active region defined by current blocking layers formed on adjacent sides of said active region channel;
said blocking layers characterized by being an aluminum-containing Group III-V compound intentionally doped with oxygen from an oxide source;
a plurality of aluminum-containing Group III-V compound layers forming a group of said blocking layers;
said aluminum-containing Group III-V compound layers selected from the group consisting of InAlAs, InAlGaAs or alternating monolayers of AlAs and InAs.

25. The active semiconductor device of claim 24 wherein said aluminum-containing Group III-V compound layers are InAlAs and InAlGaAs.

26. The active semiconductor device of claim 25 wherein said aluminum-containing Group III-V compound layers are doped with oxygen or with oxygen and iron.

27. The active semiconductor device of claim 24 wherein said aluminum-containing Group III-V compound layers are alternating layers of InAlAs and lnAlGaAs.

28. The active semiconductor device of claim 27 said alternating layers are doped with oxygen or with oxygen and iron.

29. An active semiconductor device comprising:
a plurality of semiconductor layers formed on a substrate;
an active region included within said layers;
a current channel formed through this active region defined by current blocking layers formed on adjacent sides of said active region channel;
said blocking layers characterized by being an aluminum-containing Group III-V compound intentionally doped with oxygen from an oxide source;
a plurality of aluminum-containing Group III-V compound layers forming a group of said blocking layers;
said aluminum-containing Group III-V compound layers are InAlAs:O and at least one of said layers is $In_{1-x}Al_xAs$ where $x>0.5$.

30. An active semiconductor device comprising:
a plurality of semiconductor layers formed on a substrate;
an active region included within said layers;
a current channel formed through this active region defined by current blocking layers formed on adjacent sides of said active region channel;
said blocking layers characterized by being an aluminum-containing Group III-V compound intentionally doped with oxygen from an oxide source;
a plurality of aluminum-containing Group III-V compound layers forming a group of said blocking layers;
said aluminum-containing Group III-V compound layers within said blocking layers alternated with non-aluminum-containing layers; and
at least some of said non-aluminum-containing layers are doped with oxygen or oxygen and iron.

31. The active semiconductor device of claim 30 wherein said non-aluminum-containing layers are InP:O or InP:Fe:O.

32. The active semiconductor device of claim 30 wherein said aluminum-containing Group III-V compound layers are aluminum-rich layers.

33. The active semiconductor device of claim 30 wherein said aluminum-containing Group III-V compound layers have an aluminum mole fraction content greater than 0.5.

34. An active semiconductor device comprising:
a plurality of semiconductor layers formed on a substrate;
an active region included within said layers;
a current channel formed through this active region defined by current blocking layers formed on adjacent sides of said active region channel;
said blocking layers characterized by being an aluminum-containing Group III-V compound intentionally doped with oxygen from an oxide source;
a plurality of aluminum-containing Group III-V compound layers forming a group, of said blocking layers;
said aluminum-containing Group III-V compound layers within said blocking layers alternated with non-aluminum-containing layers;
said aluminum-containing Group III-V compound layers are selected from the group consisting of InAlAs:O, InAlGaAs:O, or alternating monolayers of AlAs:O or AlGaAs:O or InAlGaAs:O and InAs.

35. An active semiconductor device comprising:
a plurality of semiconductor layers formed on a substrate;
an active region included as one or more of said layers;
a current channel formed through this active region defined by current blocking layers formed on adjacent sides of said active region channel;
said blocking layers comprising one or more aluminum-containing Group III-V compound layers are doped with oxygen;
boundary layers formed above and beneath said blocking layers comprising non-aluminum containing Group III-V compound layers which are O-doped, unintentionally doped or impurity doped or combinations thereof.

36. The active semiconductor device of claim 35 wherein said blocking layers are InAlAs:O or InAlGaAs:O.

37. The active semiconductor device of claim 35 wherein said blocking layers are co-doped with oxygen and iron.

38. The active semiconductor device of claim 37 wherein said blocking layers comprise InAlAs:Fe:O or InAlGaAs:Fe:O.

39. An active semiconductor device comprising:

a plurality of semiconductor layers formed on a substrate;

an active region included as one or more of said layers;

a current channel formed through this active region defined by current blocking layers formed on adjacent sides of said active region channel;

said current blocking layers comprising a plurality of aluminum-containing Group III-V compound layers oxidized from a diffusion source laterally from outer edges of said aluminum containing layers to oxygen dope said aluminum containing layers between said outer edges and said current channel to form Al-Group III-V:O.

40. The active semiconductor device of claim 39 wherein said diffusion source is a $H_2O$ environment or oxide layer formed on an outer edge surfaces of said blocking layers.

41. The active semiconductor device of claim 40 wherein said diffusion source is $SiO_2$ or spin-on-glass.

42. The active semiconductor device of claim 39 wherein said active region channel further comprises confining layers on either side of said active region; said confining layers comprised of non-aluminum-containing layers.

43. The active semiconductor device of claim 42 wherein said confining layers are InGaAsP.

44. The active semiconductor device of claim 39 wherein said active region channel further comprises confining layers on either side of said active region; said confining layers comprised of aluminum-containing layers.

45. The active semiconductor device of claim 44 wherein said confining layers are InAlAs or InAlGaAs; the mole fraction of aluminum in said blocking layers being greater than the mole fraction of aluminum in said confining layers.

46. The active semiconductor device of claim 39 wherein said blocking layers are InAlAs or InAlGaAs.

47. An active semiconductor device comprising:

a plurality of semiconductor layers formed on a substrate;

an active region included as one or more of said layers;

a plurality of Al containing III-V compound layers formed on adjacent planar sides of said active region;

means to define a current confining channel through said Al containing layers and said active region;

regions of said Al containing layers adjacent to said defined current confining channel oxidized from a diffusion source laterally from outer edges of said Al containing layers to oxygen dope said layers defining current blocking regions between said outer edges and said defined current confining channel.

48. The active semiconductor device of claim 47 wherein said substrate is InP and said Al containing layers comprise InAlAs or InAlGaAs or alternating layers of InAlAs and InAlGaAs.

49. The active semiconductor device of claim 48 wherein said active region is InGaAsP.

50. The active semiconductor device of claim 47 wherein said channel defining means is impurity induced disordering or selective delta doping.

51. An active semiconductor device comprising:

a plurality of originally as-grown semiconductor layers formed on a substrate;

an active region included within said layers;

a current channel that is formed through said active region by a group of current blocking layers;

said current blocking layers that are at least three layers deposited independently of and after said originally as-grown semiconductor layers and comprising a central layer of an aluminum-containing III-V compound layer intentionally doped with oxygen sandwiched between setback layers selected from the group consisting of InP, InGaAs and InGaAsP.

52. The active semiconductor device of claim 51 wherein said central layer is InAlAs:O, InAlGaAs:O or AlGaAsSb:O.

53. The active semiconductor device of claim 51 wherein said central layer is co-doped with Fe:O.

54. The active semiconductor device of 53 wherein said center layer is bounded by O-doped boundary layers.

55. The active semiconductor device of 54 wherein said boundary layers are InAlAs:O or InAlGaAs:O.

56. The active semiconductor device of claim 51 wherein said central layer is selected from the group consisting of InAlAs:O:Fe, InAlGaAs:O:Fe, or alternating monolayers of AlAs:O:Fe/InP.

57. The active semiconductor device of 56 wherein said center layer is bounded by O-doped boundary layers.

58. The active semiconductor device of 57 wherein said boundary layers are InAlAs:O or InAlGaAs:O.

59. The active semiconductor device of claim 51 wherein one of said setback layers closest to said substrate is unintentionally doped, O-doped, or n-doped or combinations thereof.

60. The active semiconductor device of claims 51 wherein one of said setback layers farthermost from said substrate is unintentionally undoped, O-doped, p-doped, n-doped or combinations thereof.

61. The active semiconductor device of claim 51 wherein said center layer comprises a plurality of aluminum-containing III-V compound layers wherein at least one of said center layers contains more aluminum content than the other of said layers, said one at least center layer is O-doped.

62. The active semiconductor device of claim 61 wherein said other of said center layers are undoped.

63. The active semiconductor device of claim 61 wherein said other of said center layers are O-doped.

64. The active semiconductor device of claim 61 wherein said plurality of aluminum-containing III-V compound layers comprise alternating sets of said center layers wherein in each set, one center layer has higher aluminum content than another center layer in the set.

65. The active semiconductor device of claim 64 wherein at least one center layer in said set of center layers is O-doped.

66. The active semiconductor device of claim 64 wherein at least one center layer in said set of center layers is O:Fe-doped.

67. The active semiconductor device of claim 66 wherein not all of said center set layers contain the same doping level of Fe.

68. The active semiconductor device of claim 66 wherein an outer boundary center set of said center set layers adjacent to said setback layers are not Fe-doped.

69. The active semiconductor device of claim 64 wherein an outer boundary center set of said center set layers are selected from the group consisting of InAlAs:O and InAlGaAs:O.

70. The active semiconductor device of claim 69 wherein at least one of said setback layers is undoped, O-doped or n-doped or Fe-doped.

71. The active semiconductor device of claim 51 wherein said center layer further comprises a plurality of aluminum-containing compound layers that are selected from the group of alternating layer sets of InAlAs:O/InAlAs:O:Fe and InAlGaAs:O/InAlAs:O:Fe.

72. The active semiconductor device of claim 51 wherein said center layer further comprises a plurality of aluminum-containing compound layers comprising a center layer selected from the group consisting of InP:Fe, InAlAs:Fe and InAlAs:Fe:O and an adjacent layer on either side of said center layer selected from the group consisting of InAlAs:O and InAlGaAs:O.

73. The active semiconductor device of claim 72 wherein at least one of said setback layers comprises intentionally undoped, n-doped, p-doped, O-doped InP or combinations thereof.

74. The active semiconductor device of claim 51 wherein said center layer further comprises a plurality of aluminum-containing compound layers that are modulated alternating alloys selected from the group consisting of InAs/AlAs:O, InAs/AlGaAs:O and InAs/InAlGaAs:O.

75. The active semiconductor device of claim 51 wherein said center layer is selected from the group consisting of intentionally undoped, O-doped, O:Fe-doped InP.

76. The active semiconductor device of claim 75 wherein at least one of said setback layers comprises n-InP or n-InP:Fe.

77. The active semiconductor device of claim 51 wherein said center layer comprises at least one layer comprising InP:Fe or InP:Fe:O.

78. The active semiconductor device of claim 51 wherein said center layer comprises InP:Fe:O, said center layer is bounded by boundary layers on either side thereof comprising InP:O.

79. An active semiconductor device manufactured in a MOCVD reactor comprising:

a plurality of semiconductor layers formed on a substrate;

an active region included within said layers;

a current channel formed through this active region defined by a plurality of current blocking layers formed on adjacent sides of said active region channel;

said blocking layers comprising aluminum-containing and non-aluminum-containing III-V compounds and are selected from the group consisting of modulated monolayers of AlAs:O, AlGaAs:O, InAlGaAs:O with InAs or InGaAs or AlInGaAs, or alternating layers of InAlAs:O with layers of InAlGaAs:O; and an oxide source in the reactor for intentional O doping of said aluminum-containing III-V compound layers during the growth of said aluminum-containing III-V compound blocking layers in said MOCVD reactor.

80. The active semiconductor device of claim 79 wherein said oxide source is a low vapor pressure source.

81. The active semiconductor device of claim 80 wherein said oxide source is nitrogenous oxide ($NO_x$) or diethyl aluminum ethoxide (DEALO).

* * * * *